US011528033B2

(12) United States Patent
Corkery et al.

(10) Patent No.: US 11,528,033 B2
(45) Date of Patent: Dec. 13, 2022

(54) NEURAL NETWORK PROCESSOR USING COMPRESSION AND DECOMPRESSION OF ACTIVATION DATA TO REDUCE MEMORY BANDWIDTH UTILIZATION

(71) Applicant: Microsoft Technology Licensing, LLC, Redmond, WA (US)

(72) Inventors: Joseph Leon Corkery, Burlingame, CA (US); Benjamin Eliot Lundell, Seattle, WA (US); Larry Marvin Wall, Seattle, WA (US); Chad Balling McBride, North Bend, WA (US); Amol Ashok Ambardekar, Redmond, WA (US); George Petre, Redmond, WA (US); Kent D. Cedola, Bellevue, WA (US); Boris Bobrov, Kirkland, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 1191 days.

(21) Appl. No.: 15/953,356

(22) Filed: Apr. 13, 2018

(65) Prior Publication Data

US 2018/0300606 A1 Oct. 18, 2018

Related U.S. Application Data

(60) Provisional application No. 62/486,432, filed on Apr. 17, 2017.

(51) Int. Cl.
*H03M 7/30* (2006.01)
*G06N 3/04* (2006.01)
(Continued)

(52) U.S. Cl.
CPC .......... *H03M 7/3059* (2013.01); *G06F 1/324* (2013.01); *G06F 1/3275* (2013.01);
(Continued)

(58) Field of Classification Search
CPC ............ G06F 7/49921; G06F 7/49947–49984; H03M 7/00; H03M 7/3059; H03M 7/3066;
(Continued)

(56) References Cited

U.S. PATENT DOCUMENTS 4,298,954 A 11/1981 Bigelow et al.
5,091,864 A 2/1992 Baji et al.
(Continued)

FOREIGN PATENT DOCUMENTS

CN 1790918 A 6/2006
CN 101183873 A 5/2008
(Continued)

OTHER PUBLICATIONS

M. Rhu, M. O'Connor, N. Chatterjee, J. Pool, Y. Kwon and S. W. Keckler, "Compressing DMA Engine: Leveraging Activation Sparsity for Training Deep Neural Networks," 2018 IEEE International Symposium on High Performance Computer Architecture (HPCA), 2018, pp. 78-91, doi: 10.1109/HPCA.2018.00017. (Year: 2018).*

(Continued)

*Primary Examiner* — Michael D. Yaary
*Assistant Examiner* — Carlo Waje
(74) *Attorney, Agent, or Firm* — Newport IP, LLC; Leonard J. Hope

(57) ABSTRACT

A deep neural network ("DNN") module compresses and decompresses neuron-generated activation data to reduce the utilization of memory bus bandwidth. The compression unit receives an uncompressed chunk of data generated by a neuron in the DNN module. The compression unit generates a mask portion and a data portion of a compressed output chunk. The mask portion encodes the presence and location of the zero and non-zero bytes in the uncompressed chunk of data. The data portion stores truncated non-zero bytes (Continued)

from the uncompressed chunk of data. A decompression unit receives a compressed chunk of data from memory in the DNN processor or memory of an application host. The decompression unit decompresses the compressed chunk of data using the mask portion and the data portion.

20 Claims, 9 Drawing Sheets

(51) Int. Cl.

| | | |
|---|---|---|
| G06N 3/063 | (2006.01) | |
| G06F 12/0862 | (2016.01) | |
| G06F 9/46 | (2006.01) | |
| G06F 1/324 | (2019.01) | |
| G06F 3/06 | (2006.01) | |
| G06F 9/38 | (2018.01) | |
| G06F 12/08 | (2016.01) | |
| G06F 12/10 | (2016.01) | |
| G06F 15/80 | (2006.01) | |
| G06F 17/15 | (2006.01) | |
| G06N 3/06 | (2006.01) | |
| G06N 3/08 | (2006.01) | |
| G06N 3/10 | (2006.01) | |
| H04L 45/02 | (2022.01) | |
| H04L 67/02 | (2022.01) | |
| G06F 9/30 | (2018.01) | |
| H04L 67/1001 | (2022.01) | |
| G06F 9/48 | (2006.01) | |
| G06F 12/02 | (2006.01) | |
| G06F 13/16 | (2006.01) | |
| G06F 1/3234 | (2019.01) | |
| G06F 13/28 | (2006.01) | |
| H03M 7/46 | (2006.01) | |
| H04L 45/50 | (2022.01) | |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 9/4881* (2013.01); *G06F 12/0207* (2013.01); *G06F 12/0238* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1001* (2022.05); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(58) Field of Classification Search
CPC .............. H03M 5/00; H03M 7/30–707; G06N 3/00–126
USPC ...................................... 708/203; 341/50, 51
See application file for complete search history.

(56) References Cited

U.S. PATENT DOCUMENTS

| | | |
|---|---|---|
| 5,369,773 A | 11/1994 | Hammerstrom |
| 5,487,153 A | 1/1996 | Hammerstrom et al. |
| 5,524,175 A | 6/1996 | Sato et al. |
| 5,644,749 A | 7/1997 | Obayashi |
| 5,859,990 A | 1/1999 | Yarch |
| 5,933,654 A | 8/1999 | Galdun et al. |
| 6,307,867 B1 | 10/2001 | Roobol et al. |
| 6,654,730 B1 | 11/2003 | Kato et al. |
| 6,785,239 B1 | 8/2004 | Tasker |
| 6,990,079 B2 | 1/2006 | Vrabel |
| 7,012,893 B2 | 3/2006 | Bahadiroglu |
| 7,480,640 B1 | 1/2009 | Elad et al. |
| 7,539,608 B1 | 5/2009 | Dageville et al. |
| 7,694,084 B2 | 4/2010 | Raghavan et al. |
| 8,244,953 B1 | 8/2012 | Kumar |
| 8,442,927 B2 | 5/2013 | Chakradhar et al. |
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 9,851,771 B2 | 12/2017 | Cooper et al. |
| 9,990,307 B1 | 6/2018 | Patel et al. |
| 10,275,001 B2 | 4/2019 | Kam et al. |
| 2002/0133648 A1 | 9/2002 | Goudie et al. |
| 2003/0065631 A1 | 4/2003 | Mcbride |
| 2003/0120799 A1 | 6/2003 | Lahav et al. |
| 2003/0200315 A1 | 10/2003 | Goldenberg et al. |
| 2004/0187135 A1 | 9/2004 | Pronovost et al. |
| 2005/0204189 A1 | 9/2005 | Akiba |
| 2005/0216616 A1 | 9/2005 | Eldar et al. |
| 2006/0047864 A1 | 3/2006 | Brokenshire et al. |
| 2007/0145151 A1 | 6/2007 | Nakamura et al. |
| 2008/0043742 A1 | 2/2008 | Pong et al. |
| 2008/0052441 A1 | 2/2008 | Freking et al. |
| 2008/0112438 A1 | 5/2008 | Ying et al. |
| 2008/0313385 A1 | 12/2008 | Vijayakumar et al. |
| 2008/0319933 A1 | 12/2008 | Moussa et al. |
| 2009/0037697 A1 | 2/2009 | Ramani et al. |
| 2009/0313195 A1 | 12/2009 | McDaid et al. |
| 2010/0180100 A1 | 7/2010 | Lu et al. |
| 2010/0257174 A1 | 10/2010 | Minuti |
| 2010/0281192 A1 | 11/2010 | Rakib et al. |
| 2010/0312735 A1 | 12/2010 | Knoblauch |
| 2011/0246722 A1 | 10/2011 | Taha et al. |
| 2012/0124113 A1* | 5/2012 | Zalik ................... H03M 7/3075 708/203 |
| 2012/0130928 A1 | 5/2012 | Bell et al. |
| 2012/0134449 A1 | 5/2012 | Chen et al. |
| 2014/0046882 A1 | 2/2014 | Wood |
| 2014/0181464 A1 | 6/2014 | Forsyth et al. |
| 2014/0281221 A1 | 9/2014 | Wang et al. |
| 2014/0372670 A1 | 12/2014 | Vasilyuk |
| 2015/0363239 A1 | 12/2015 | Hsu et al. |
| 2016/0098388 A1 | 4/2016 | Blevins et al. |
| 2016/0184587 A1 | 6/2016 | Heuvel et al. |
| 2016/0267377 A1 | 9/2016 | Pan et al. |
| 2016/0328644 A1 | 11/2016 | Lin et al. |
| 2016/0335119 A1 | 11/2016 | Merrill et al. |
| 2016/0350653 A1 | 12/2016 | Socher et al. |
| 2017/0011288 A1 | 1/2017 | Brothers et al. |
| 2017/0199902 A1 | 7/2017 | Mishra et al. |
| 2017/0293659 A1* | 10/2017 | Huang ................ H03M 7/3066 |
| 2018/0299943 A1 | 10/2018 | Mcbride et al. |
| 2018/0300601 A1 | 10/2018 | Cedola et al. |
| 2018/0300602 A1 | 10/2018 | Petre et al. |
| 2018/0300603 A1 | 10/2018 | Ambardekar et al. |
| 2018/0300604 A1 | 10/2018 | Mcbride et al. |
| 2018/0300605 A1 | 10/2018 | Ambardekar et al. |
| 2018/0300607 A1 | 10/2018 | Petre et al. |
| 2018/0300613 A1 | 10/2018 | Petre et al. |
| 2018/0300614 A1 | 10/2018 | Ambardekar et al. |
| 2018/0300615 A1 | 10/2018 | Ambardekar et al. |
| 2018/0300616 A1 | 10/2018 | Ambardekar et al. |
| 2018/0300617 A1 | 10/2018 | Mcbride et al. |

(56) References Cited

U.S. PATENT DOCUMENTS

| | | | |
|---|---|---|---|
| 2018/0300633 A1 | 10/2018 | Mcbride et al. | |
| 2018/0300634 A1 | 10/2018 | Mcbride et al. | |
| 2019/0081637 A1* | 3/2019 | Pool | G06N 7/005 |
| 2020/0233820 A1 | 7/2020 | Mcbride et al. | |

FOREIGN PATENT DOCUMENTS

| | | |
|---|---|---|
| CN | 102332162 A | 1/2012 |
| CN | 102523452 A | 6/2012 |
| CN | 106250981 A | 12/2016 |
| CN | 106530200 A | 3/2017 |
| EP | 0147857 A2 | 7/1985 |
| EP | 2945290 A2 | 11/2015 |
| EP | 3035204 A1 | 6/2016 |
| EP | 3035249 A1 | 6/2016 |
| JP | 2000059227 A | 2/2000 |
| WO | 1993014459 A1 | 7/1993 |
| WO | 0154285 A1 | 7/2001 |
| WO | 2016118257 A1 | 7/2016 |
| WO | 2016210030 A1 | 12/2016 |

OTHER PUBLICATIONS

"Notice of Allowance Issued in U.S. Appl. No. 15/702,311", dated Sep. 11, 2019, 6 Pages.
"Ex Parte Quayle Action Issued in U.S. Appl. No. 15/950,644", Mailed Date: Sep. 23, 2019, 7 Pages.
"Non Final Office Action Issued in U.S. Appl. No. 15/702,311", dated May 21, 2019, 12 Pages.
"Notice of Allowance and Search Report Issued in Chinese Patent Application No. 201880025420.1", dated Dec. 29, 2020, 5 Pages.
"Office Action and Search Report Issued in Chilean Patent Application No. 201902864", dated Jan. 14, 2021, 9 Pages.
"Office Action Issued in Indonesia Patent Application No. P00201909212", dated Nov. 8, 2021, 6 Pages.
"Notice of Allowance Issued in Japanese Patent Applicant No. 2019-555659", dated Dec. 7, 2021, 5 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Non Final Office Action Issued in U.S. Appl. No. 15/702,311", dated Jun. 29, 2018, 10 Pages.
"International Search Report and Written Opinion Issued in PCT Application No. PCT/US2018/026358", dated Jul. 11, 2018, 15 Pages.
"International Search Report and Written Opinion Issued in PCT Application No. PCT/US2018/026352", dated Jun. 27, 2018, 11 Pages.
"International Search Report and Written Opinion Issued in PCT Application No. PCT/US2018/026353", dated Jul. 6, 2018, 15 Pages.
"International Search Report and Written Opinion Issued in PCT Application No. PCT/US2018/026354", dated Jul. 31, 2018, 15 Pages.
"International Search Report and Written Opinion Issued in PCT Application No. PCT/US2018/026355", dated Jul. 9, 2018, 16 Pages.
"International Search Report and Written Opinion Issued in PCT Application No. PCT/US2018/026356", dated Jul. 6, 2018, 16 Pages.
"International Search Report and Written Opinion Issued in PCT Application No. PCT/US2018/026357", dated Jul. 9, 2018, 16 Pages.
"Notice of Allowance Issued in U.S. Appl. No. 15/694,663", dated May 8, 2020, 9 Pages.
"First Office Action and Search Report Issued in Chinese Patent Application No. 201880025420.1", dated Sep. 24, 2020, 6 Pages.
Chi, et al., "PRIME: A Novel Processing-in-memory Architecture for Neural Network Computation in ReRAM-based Main Memory", in Proceedings of ACM/IEEE 43rd Annual International Symposium on Computer Architecture, Jun. 18, 2016, 13 Pages.
"Neural Processors", Retrieved From: http://web.archive.org/web/20160710035637/https://intuit.ru/studies/courses/45/45/lecture/1350?page=2, Retrieved on: Jul. 10, 2016, 2 Pages.
"Notice of Allowance Issued in Russian Patent Application No. 2019136750", dated Dec. 22, 2021, 24 Pages.
Fang, et al., "A VLSI Neural Processor for Image Data Compression using Self-Organization Networks", in Proceedings of IEEE Transactions on Neural Networks, vol. 3, Issue 3, May 1992, pp. 506-518.
"Office Action Issued in Indian Patent Application No. 201947039584", dated Feb. 2, 2022, 5 Pages.
"Office Action Issued in Australian Patent Application No. 2018256212", dated Jun. 15, 2022, 2 Pages.
"Notice of Allowance Issued in Indonesian Patent Application No. P00201909212", dated Jun. 28, 2022, 4 Pages.
"Notice of Allowance Issued in Australian Patent Application No. 2018256212", dated Jul. 28, 2022, 3 Pages.

\* cited by examiner

NEURAL NETWORK PROCESSOR USING COMPRESSION AND DECOMPRESSION OF ACTIVATION DATA TO REDUCE MEMORY BANDWIDTH UTILIZATION

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power and reducing the power consumption of POE devices like security cameras permits the use of POE switches that provide less power.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A DNN module, or processor, is disclosed that can compress and decompress activation data to reduce the utilization of memory bus bandwidth. In particular, the DNN module can utilize compression to reduce the utilization of bus bandwidth between neuron output and on-board or off-board memory. The DNN module can also utilize decompression to reduce the utilization of memory bus bandwidth between on-board or off-board memory and neuron input. Reduced bandwidth utilization can enable faster processing and, consequently, can also reduce power consumption. Other technical benefits not specifically mentioned herein can also be realized through implementations of the disclosed subject matter.

In order to realize the technical benefits mentioned briefly above, a DNN processor is disclosed that includes one or more neurons and a compression unit. The compression unit can receive an uncompressed chunk of data generated by one or more of the neurons. The uncompressed chunk of data includes a fixed number of bytes, such as 64 bytes, in some embodiments.

In order to compress the uncompressed chunk of data, the compression unit can generate a mask portion and a data portion of a compressed output chunk. The mask portion of the compressed output chunk includes a number of bits equivalent to the fixed number of bytes in the uncompressed chunk of data. For instance, if the uncompressed chunk of data includes 64 bytes of data, the mask portion will include 64 bits (i.e. 8 bytes).

Each bit in the mask portion of the compressed output chunk corresponds to a byte in the uncompressed chunk of data in some embodiments. For instance, bit one of the mask portion can correspond to the first byte in the uncompressed chunk of data, bit two of the mask portion can correspond to the second byte in the uncompressed chunk of data, and so on. In other embodiments, two or more bits in the mask portion of the compressed output chunk correspond to a byte in the uncompressed chunk of data. In these embodiments, the bits in the mask portion of the compressed output chunk can indicate that not only is a corresponding byte in the uncompressed chunk but also its approximate magnitude.

When individual bits of the mask portion correspond to bytes in the uncompressed chunk, the compression unit sets each bit in the mask portion of the compressed output chunk to a logical false (which might also be referred to herein as a "logical zero"), where a corresponding byte in the uncompressed chunk of data contains all zeros (i.e. a "zero byte"). The compression unit also sets each bit in the mask portion of the compressed output chunk to a logical true (which might also be referred to herein as a "logical one"), where a corresponding byte in the uncompressed chunk of data contains at least one non-zero bit (i.e. a "non-zero byte"). In this manner, the mask portion of the compressed output chunk encodes the presence and location of the zero and non-zero bytes in the uncompressed chunk of data.

The compression unit generates the data portion of the compressed output chunk by determining the number of non-zero bytes in the uncompressed chunk of data. The compression unit then determines, based on the number of non-zero bytes in the uncompressed chunk of data and the number of bytes available in the data portion of the compressed output chunk, the number of bits in the data portion of the compressed output chunk that are available to store each non-zero byte of the uncompressed chunk of data. For example, if the data portion of the compressed chunk of data is 24 bytes wide (i.e. 192 bits) and there are 47 non-zero bytes in the uncompressed chunk of data, four bits are available in the data portion to store each non-zero byte from the uncompressed chunk of data.

In some embodiments, the compression unit can also determine the number of additional bits, if any, in the data portion of the compressed output chunk that are available to store non-zero bytes of the uncompressed chunk of data. In the example given above, for instance, four additional bits are available for storing non-zero bytes (i.e. 192 mod 47=four bits). The compression unit can assign these additional bits to one or more of the non-zero bytes in the uncompressed chunk of data prior to truncating the one or more of the non-zero bytes. For instance, the compression unit might assign these additional bits to the first few bytes in the data portion of the compressed output chunk.

The compression unit then truncates the non-zero bytes in the uncompressed chunk of data to the determined number of bits available in the data portion to store each non-zero byte (i.e. four in the example given above). The compression unit truncates the least significant bits ("LSBs") of the non-zero bytes to fit within the available number of bits in the data portion in one embodiment. In another embodiment, the compression unit truncates the most significant bits ("MSBs") of the non-zero bytes. The compression unit then stores the truncated non-zero bytes in the data portion of the compressed output chunk. The compressed output chunk, including the mask portion and the data portion, can then be output, for example to on-board memory in the DNN processor or off-board memory of an application host of the DNN processor.

The DNN module can also include a decompression unit that can decompress chunks of data that have been compressed in the manner described above. For example, the decompression unit can receive a compressed chunk of data from memory in the DNN processor or memory of an application host. The decompression unit can then determine the number of non-zero bytes in the data portion of the uncompressed chunk of data based upon the number of logical true bits in the mask portion of the compressed output chunk. The decompression unit can also determine the locations of the non-zero bytes in the uncompressed chunk of data based upon the locations of the logical true bits in the mask portion of the compressed output chunk. The decompression unit can determine the location of the zero bytes in the uncompressed chunk of data in a similar manner.

The decompression unit can also determine the number of bits used by the compression unit to store the truncated non-zero bytes in the data portion of the compressed output chunk. The decompression unit can determine the number of bits used to store each truncated non-zero byte based on the number of non-zero bytes in the compressed chunk of data and the number of bytes available in the data portion of the uncompressed output chunk.

In the example given above, for instance, if the data portion of the compressed chunk of data is 24 bytes wide (i.e. 192 bits) and there are 47 non-zero bytes in the uncompressed chunk of data, the compression unit utilized four bits to store each truncated non-zero byte of the uncompressed chunk of data in the data portion. The decompression unit can also determine the number of additional bits, if any, that the compression unit allocated to one or more of the truncated non-zero bytes stored in the data portion of the compressed output chunk.

For each bit position in the mask portion of the compressed output chunk that is a logical zero, the decompression unit inserts a zero byte into the corresponding position of the decompressed output chunk. For each position in the mask portion that is a logical one, the decompression unit inserts the truncated non-zero byte from the corresponding position of the compressed input chunk into a corresponding position of the decompressed output chunk along with a number of zero bits equivalent to the number of bits truncated during compression of the compressed output chunk. The zero bits can be inserted into the LSBs or MSBs of the truncated non-zero bytes depending upon which bits were truncated during compression.

In some embodiments, the decompression unit also adds an offset (e.g. 00000001) to one or more of the truncated non-zero bytes stored in the decompressed output chunk. For instance, an offset can be added to non-zero bytes of the uncompressed chunk of data that become zero bytes following compression. In this manner, non-zero bytes will not become zero bytes when compressed and decompressed. An offset can be added to all of the bytes in the decompressed output chunk in other embodiments.

As discussed briefly above, implementations of the technologies disclosed herein can reduce memory bus bandwidth utilization in a DNN module, allow a DNN module to complete processing operations more quickly, and reduce power consumption. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
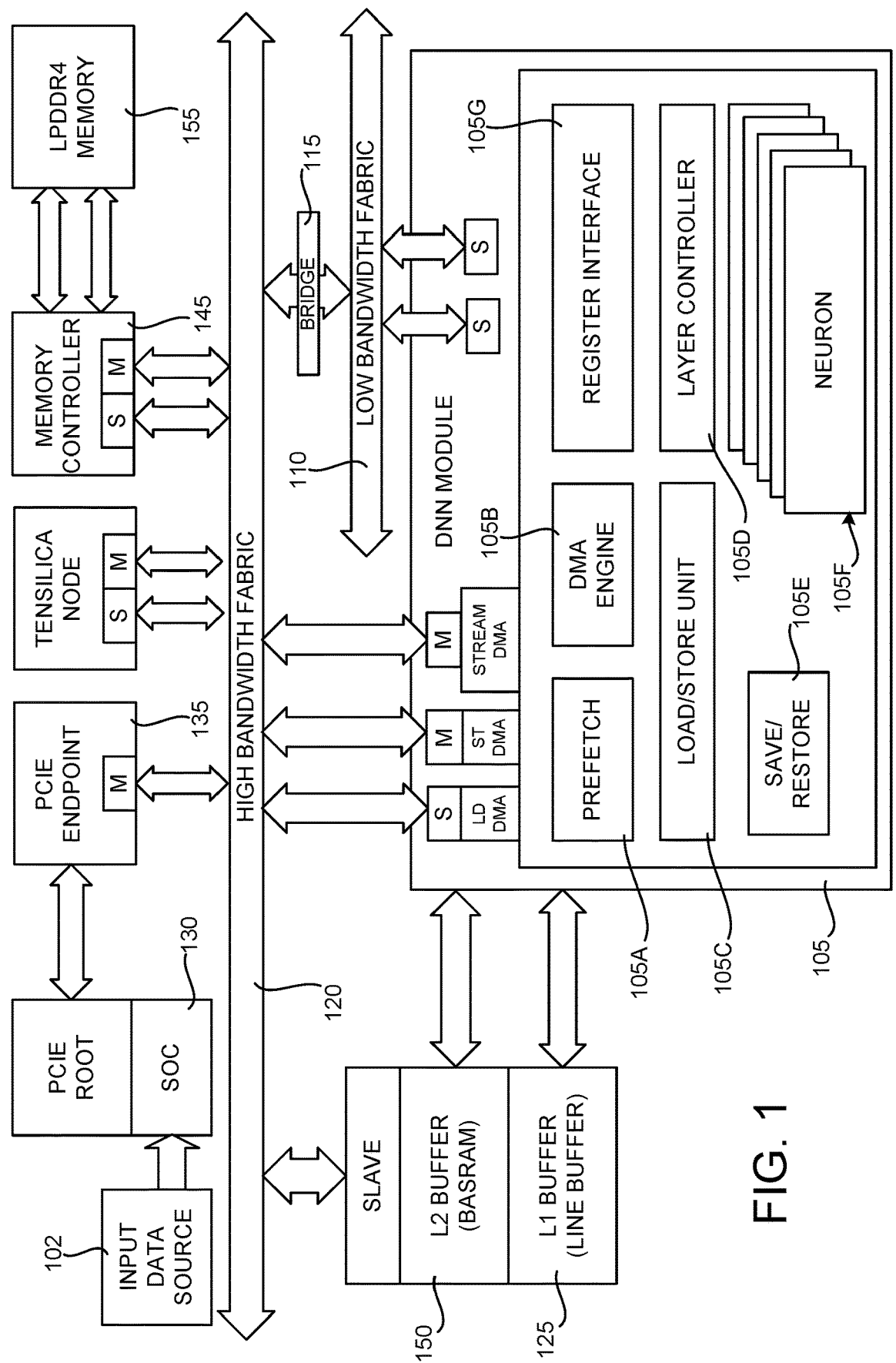
FIG. 1 is a computing architecture diagram that shows aspects of the configuration and operation of a DNN module that implements aspects of the technologies disclosed herein, according to one embodiment.

The following detailed description is directed to a DNN module that can compress and decompress activation data to reduce the utilization of memory bus bandwidth. As discussed briefly above, implementations of the disclosed technologies can reduce memory bus bandwidth utilization in a DNN module, allow a DNN module to complete processing operations more quickly, and reduce power consumption. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

As will be described in greater detail below, a DNN module is disclosed that is configured to compress the output of its neurons. The compressed output can be stored in memory on the DNN module or in memory that is external to the DNN module, such as memory provided by an application host for the DNN module. The DNN module can later decompress the previously-compressed data and provide the decompressed data to the neurons.

According to one embodiment, a compression unit in the DNN processor compresses fixed length chunks (e.g. 64 bytes) of uncompressed activation data at a fixed compression ratio (e.g. 2:1). The compressed activation data generated by the compression unit can include chunks of data having a fixed length (e.g. 32 bytes), which include a fixed-length mask portion (e.g. 8 bytes) and a fixed-length data portion (e.g. 24 bytes).

The bits of the mask portion of a compressed output chunk correspond to bytes within an uncompressed input chunk in one embodiment. For instance, the first bit of a mask portion can correspond to the first byte in an uncompressed input chunk, the second bit of the mask portion can correspond to the second byte in the uncompressed input chunk, and so on. Bits in the mask portion of the compressed activation data can be set to a logical zero if the corresponding byte in the uncompressed input chunk is zero and can be set to a logical one if the corresponding byte in the uncompressed input chunk is non-zero.

As discussed briefly above, two or more bits in the mask portion of the compressed output chunk correspond to a byte in the uncompressed chunk of data in some embodiments. In these embodiments, the bits in the mask portion of the compressed output chunk can indicate that not only is a corresponding byte in the uncompressed chunk but also its approximate magnitude.

The data portion of a compressed output chunk includes the non-zero bytes of an uncompressed input chunk that have been truncated to represent the non-zero bytes of the input chunk using the number of available bits in the compressed data portion. The number of available bits in the data portion of the compressed output chunk for each non-zero byte is determined in some embodiments by dividing the total number of available bits in the data portion (e.g. 192 bits) by the number of non-zero bytes in the uncompressed input chunk. The result of this computation indicates the number of bits in the data portion of the compressed output chunk that are available for representing each byte of non-zero data in the uncompressed input chunk. Any remaining bits can be used to provide an additional bit for representing some of the non-zero values in the data portion of the compressed output chunk.

Once the number of bits available in the data portion of the compressed output chunk to represent each non-zero byte in the uncompressed input chunk has been determined, the LSBs of the non-zero values in the uncompressed input chunk are truncated to fit within the available number of bits. The MSBs of the non-zero values might be truncated in other embodiments. The truncated non-zero values can then be stored in the data portion of the compressed output chunk. This process can be repeated for each chunk of uncompressed input activation values. The compressed output chunks can then be stored in on- or off-module memory for later decompression and use by the neurons.

The disclosed DNN module can also include a decompression unit for decompressing activation values that have been compressed by the compression unit in the manner described above. The decompression unit receives chunks of compressed activation data that include a mask portion and a data portion. The decompression unit can utilize the bits of the mask portion to identify the number of non-zero bytes that will be present in a decompressed output chunk and their locations within the decompressed output chunk. The mask also indicates the locations of zero bytes in the decompressed output chunk.

In some embodiments, the decompression unit determines the number of bits that were used by the compression unit to represent each non-zero byte by dividing the total number of available bits in the data portion (e.g. 192 bits) of a compressed chunk by the number of non-zero bytes in the uncompressed input chunk as specified by the mask. The decompression unit can also assume that the compression unit used any remaining bits to provide an additional bit for representing some of the non-zero values in the data portion of the compressed chunk (e.g. the first N values).

For each bit position in the mask that is a logical zero, the decompression unit can insert a zero byte into the decompressed output chunk at its corresponding position. For each bit position in the mask that is a logical one, the decompression unit inserts the truncated non-zero bytes from the corresponding position in the data portion of the compressed input chunk at the corresponding position in the decompressed output chunk. The decompression unit also inserts zeros in the LSBs, or MSBs as appropriate, of the non-zero values to replace those bits that were truncated during compression.

In some embodiments, the decompression unit adds an offset value to the truncated non-zero values to ensure that non-zero uncompressed values do not become zero bytes when decompressed. The decompressed output chunk can then be stored in on- or off-module memory for use by the neurons. Additional details regarding the operation of the DNN module, the compression unit, and the decompression unit will be provided below.

In the following detailed description, references are made to the accompanying drawings that form a part hereof, and which are shown by way of illustration specific configurations or examples. Referring now to the drawings, in which like numerals represent like elements throughout the several FIGS., aspects of a DNN module that can compress and decompress activation data to reduce the utilization of memory bus bandwidth will be described.

FIG. 1 is a computing architecture diagram that shows aspects of the configuration and operation of a DNN module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with an activation function applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. The activation function allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: memory-to-memory move ("M2M") descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random access memory ("SRAM") memory. The operational descriptors are processed in order and are capable of many different layer operations, at least some of which are described herein.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity with a high speed private interface operating at a selected frequency. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2A:
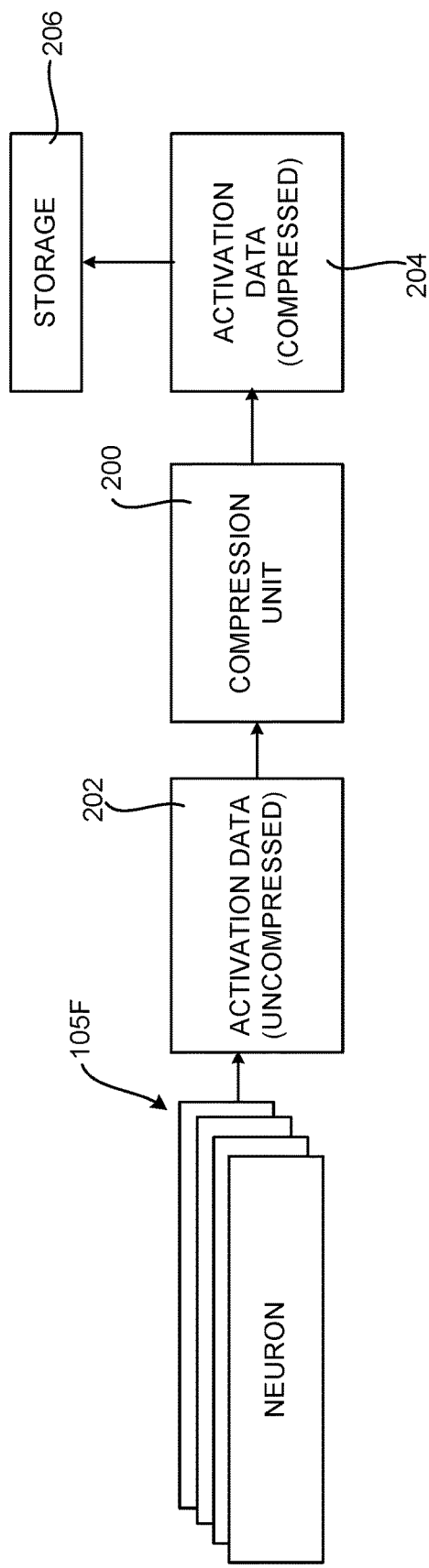
FIGS. 2A and 2B are computing system architecture diagrams showing aspects of the configuration and operation of a DNN module for compressing activation data, according to one embodiment.
Figure 2B:
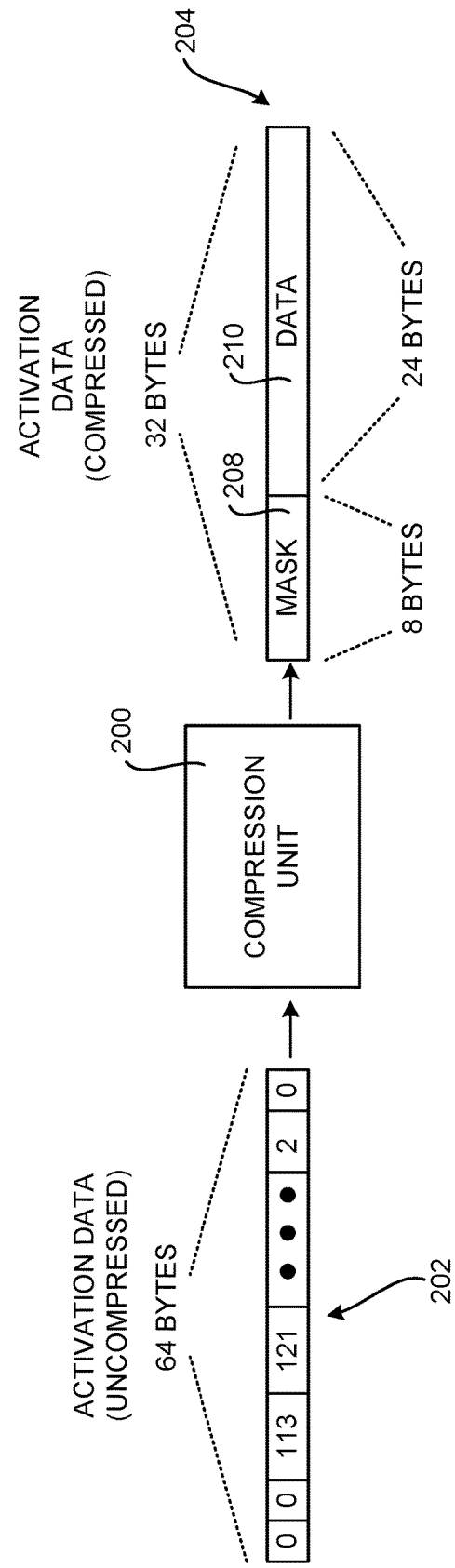

FIGS. 2A and 2B are computing system architecture diagrams showing aspects of the configuration and operation of the DNN module 105 for compressing activation data, according to one embodiment. As shown in FIG. 2A and discussed briefly above, the DNN module 105 includes one or more neurons 105F and a compression unit 200. The compression unit 200 is implemented by the load/store unit 105C in some embodiments but might be implemented in other ways in other embodiments.

The compression unit 200 can receive an uncompressed chunk of activation data 202 generated by one or more of the neurons 105F. The uncompressed chunk of data 202 includes a fixed number of bytes, such as 64 bytes, in some embodiments.

The compression unit 200 can compress the uncompressed chunk of data 202 to generate a compressed chunk of activation data 204. The compressed chunk of activation data 204 can then be stored in memory 206. For instance, the compressed chunk of activation data 204 can be stored in the LPDDR4 memory 155 provided by the application host or can be stored in the BASRAM 150 provided by the DNN module 105. As will be disclosed in greater detail below, the technologies disclosed herein can utilize compression and decompression to reduce the utilization of memory bus utilization when storing or retrieving compressed or decompressed activation data from the LPDDR4 memory 155 or the BASRAM 150. Additional details regarding these technologies are disclosed below with regard to FIGS. 2A-9.

As illustrated in FIG. 2B, the compression unit 200 can generate a mask portion 208 and a data portion 210 of a compressed output chunk of data 204. The mask portion 208 of the compressed output chunk 204 includes a number of bits equivalent to the fixed number of bytes in the uncompressed chunk of data 202. For instance, if the uncompressed chunk of data 202 includes 64 bytes of data, the mask portion 208 of the compressed output chunk 204 will include 64 bits (i.e. 8 bytes).

Each bit in the mask portion 208 of the compressed output chunk 204 corresponds to a byte in the uncompressed chunk of data 202 in some embodiments. For instance, bit one of the mask portion 208 can correspond to the first byte in the uncompressed chunk of data 202, bit two of the mask portion 208 can correspond to the second byte in the uncompressed chunk of data 202, and so on.

The compression unit 200 sets each bit in the mask portion 208 of the compressed output chunk 204 to a logical zero where a corresponding byte in the uncompressed chunk of data 202 is a zero byte. The compression unit 200 also sets each bit in the mask portion 208 of the compressed output chunk 204 to a logical one, where a corresponding byte in the uncompressed chunk of data 202 is a non-zero byte. In this manner, the mask portion 208 of the compressed output chunk 204 encodes the presence and location of the zero and non-zero bytes in the uncompressed chunk of data 202.

The compression unit 200 generates the data portion 210 of the compressed output chunk 204 by determining the number of non-zero bytes in the uncompressed chunk of data 202. The compression unit 200 then determines, based on the number of non-zero bytes in the uncompressed chunk of data 202 and the number of bytes available in the data portion 210 of the compressed output chunk 204, the number of bits in the data portion 210 of the compressed output chunk 204 that are available to store each non-zero byte of the uncompressed chunk of data 202. For example, if the data portion 210 of the compressed chunk of data 204 is 24 bytes wide (i.e. 192 bits) and there are 47 non-zero bytes in the uncompressed chunk of data 202, four bits are available in the data portion 210 to store each non-zero byte from the uncompressed chunk of data 202.

In some embodiments, the compression unit 200 can also determine the number of additional bits, if any, in the data portion 210 of the compressed output chunk 204 that are available to store non-zero bytes of the uncompressed chunk of data 202. In the example given above, for instance, four additional bits are available for storing non-zero bytes (i.e. 192 mod 47=four bits). The compression unit 200 can assign these additional bits to one or more of the non-zero bytes in the uncompressed chunk of data 204 prior to truncating the one or more of the non-zero bytes. For instance, the compression unit 200 might assign these additional bits to the first N bytes in the data portion 210 of the compressed output chunk 204.

The compression unit 200 then truncates the non-zero bytes in the uncompressed chunk of data 202 to the determined number of bits available in the data portion 210 to store each non-zero byte (i.e. four in the example given above). The compression unit 200 truncates the LSBs of the non-zero bytes to fit within the available number of bits in the data portion 210 in one embodiment. In another embodiment, the compression unit 200 truncates the MSBs of the non-zero bytes. The compression unit 200 then stores the truncated non-zero bytes in the data portion 210 of the compressed output chunk 204. The compressed output chunk 204, including the mask portion 208 and the data portion 210, can then be output, for example to on-board memory in the DNN module 105 or off-board memory of an application host of the DNN module 105. Additional details regarding the compression process described above will be provided below with regard to FIGS. 3 and 4.

As discussed briefly above, two or more bits in the mask portion 208 of the compressed output chunk 204 correspond to a byte in the uncompressed chunk of data 202 in some embodiments. In these embodiments, the bits in the mask portion 208 of the compressed output chunk 204 can indicate that not only is a corresponding byte in the uncompressed chunk 202 but also its approximate magnitude. For example, and without limitation, the mask portion 208 might include two bits per byte in the uncompressed chunk of data 202. In this example, 00 can indicate that the MSB of the corresponding non-zero value in the uncompressed chunk of data 202 is zero, 01 can indicate that the MSB is <64, 10 can indicate that the MSB is <128, and 11 can indicate that the MSB>128. These values can be utilized to identify which MSBs of the bytes in the uncompressed chunk of data 202 can be truncated. For instance, if the MSB of a particular byte is <64, then the top two MSBs can be truncated without loss of data.

Figure 3:
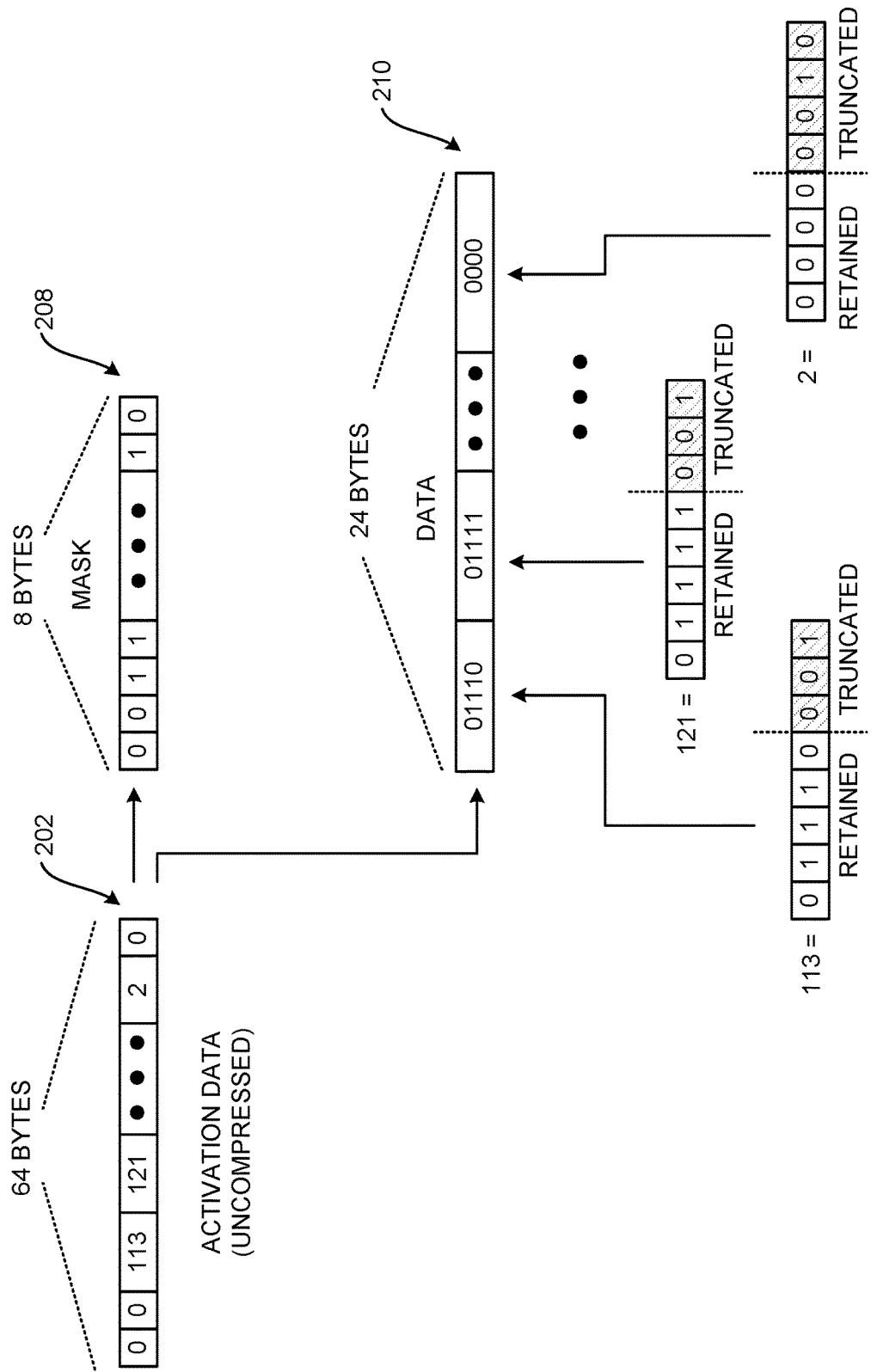
FIG. 3 is a data structure diagram that illustrates aspects of the operation of a DNN module for compressing activation data with reference to an example chunk of uncompressed activation data, according to one embodiment.

FIG. 3 is a data structure diagram that illustrates aspects of the operation of the DNN module 105 for compressing chunks of uncompressed activation data 202 with reference to an example chunk of uncompressed activation data 202, according to one embodiment. In the example shown in FIG. 3, an uncompressed chunk of activation data 202 is 64 bytes long. Bytes zero, one, and 63 of the chunk of uncompressed activation data 202 are zero bytes. Bytes two, three, and 62 of the chunk of uncompressed activation data 202 are non-zero bytes, storing the values 112, 121, and two, respectively. Bytes 4 through 61 of the example chunk of uncompressed activation data 202 can store zero or non-zero bytes.

As discussed above, the compression unit 200 can generate a mask portion 208 that encodes the presence and location of the zero and non-zero bytes in the uncompressed chunk of activation data 202. In this example, for instance, bits zero, one and 63 of the mask portion 208 have been set to logical zeros to indicate the presence of zero bytes in the corresponding locations in the uncompressed chunk of activation data 202. Similarly, bits two, three, and 62 of the mask portion 208 have been set to logical one to indicate that bytes two, three, and 62 of the uncompressed chunk of activation data 202 store non-zero bytes.

As discussed above, the compression unit 200 generates the data portion 210 of the compressed output chunk 204 by determining the number of non-zero bytes in the uncompressed chunk of data 202. In the example shown in FIG. 3, for instance, the uncompressed chunk of data 202 includes 47 non-zero bytes (not all of which are shown in FIG. 3). The compression unit 200 then determines, based on the number of non-zero bytes in the uncompressed chunk of data 202 and the number of bytes available in the data portion 210 of the compressed output chunk 204, the number of bits in the data portion 210 of the compressed output chunk 204 that are available to store each non-zero byte of the uncompressed chunk of data 202.

In the example shown in FIG. 3, for instance, the data portion 210 of the compressed chunk of data 204 is 24 bytes wide (i.e. 192 bits) and there are 47 non-zero bytes in the uncompressed chunk of data 202. As a result, four bits are available in the data portion 210 to store each non-zero byte from the uncompressed chunk of data 202 (i.e. 192/47=4 remainder 4).

As also discussed above, the compression unit 200 can also determine the number of additional bits, if any, in the data portion 210 of the compressed output chunk 204 that are available to store non-zero bytes of the uncompressed chunk of data 202. In the example shown in FIG. 3, for instance, four additional bits are available for storing non-zero bytes (i.e. 192 mod 47=four bits). The compression unit 200 can assign these additional bits to one or more of the non-zero bytes in the uncompressed chunk of data 204 prior to truncating the one or more of the non-zero bytes. In the example shown in FIG. 3, one of the four additional bits has been assigned to each of the first four non-zero bytes in the chunk of uncompressed activation data 202. As a result, the first four bytes of the uncompressed chunk of activation data 202 will be truncated to five bits rather than four.

The compression unit 200 then truncates the non-zero bytes in the uncompressed chunk of data 202 to the determined number of bits available in the data portion 210 to store each non-zero byte (i.e. five bits for the first four non-zero bytes four in the example given above). In the example shown in FIG. 3, the compression unit 200 truncates the LSBs of the non-zero bytes to fit within the available number of bits (i.e. four in this example) in the data portion 210 in one embodiment. In another embodiment, the compression unit 200 truncates the MSBs of the non-zero bytes.

As shown in FIG. 3, the second byte of the uncompressed chunk of activation data 202 stores the value 113 (01110001). Because five bits have been assigned to the first four non-zero values in the uncompressed chunk of activation data 202, the three LSBs of this value are truncated resulting in the value 01110 being stored in the first location in the compressed chunk of activation data 210. The third byte of the uncompressed chunk of activation data 202 stores the value 121 (01111001). Because five bits have been assigned to the first four non-zero values in the uncompressed chunk of activation data 202, the three LSBs of this value are truncated resulting in the value 01111 being stored in the second location in the compressed chunk of activation data 210.

In the example shown in FIG. 3, the $62^{nd}$ byte of the uncompressed chunk of activation data 202 stores the value 2 (00000010). Because four bits have been assigned to the $5^{th}$ to $63^{rd}$ non-zero values in the uncompressed chunk of activation data 202, the four LSBs of this value are truncated resulting in the value 0000 being stored in the $62^{nd}$ location in the compressed chunk of activation data 210. Other non-zero bytes in the uncompressed chunk of activation data 202 can be truncated and stored in the data portion 210 of the compressed chunk of activation data 204 in a similar manner.

Once all of the non-zero bytes of the chunk of uncompressed activation data 202 have been stored in the data portion 210, the compression unit 200 stores the compressed output chunk 204, including the mask portion 208 and the data portion 210, for example in on-board memory in the DNN module 105 or off-board memory of an application host of the DNN module 105. Additional details regarding the compression process are provided below with regard to FIG. 4.

Figure 4:
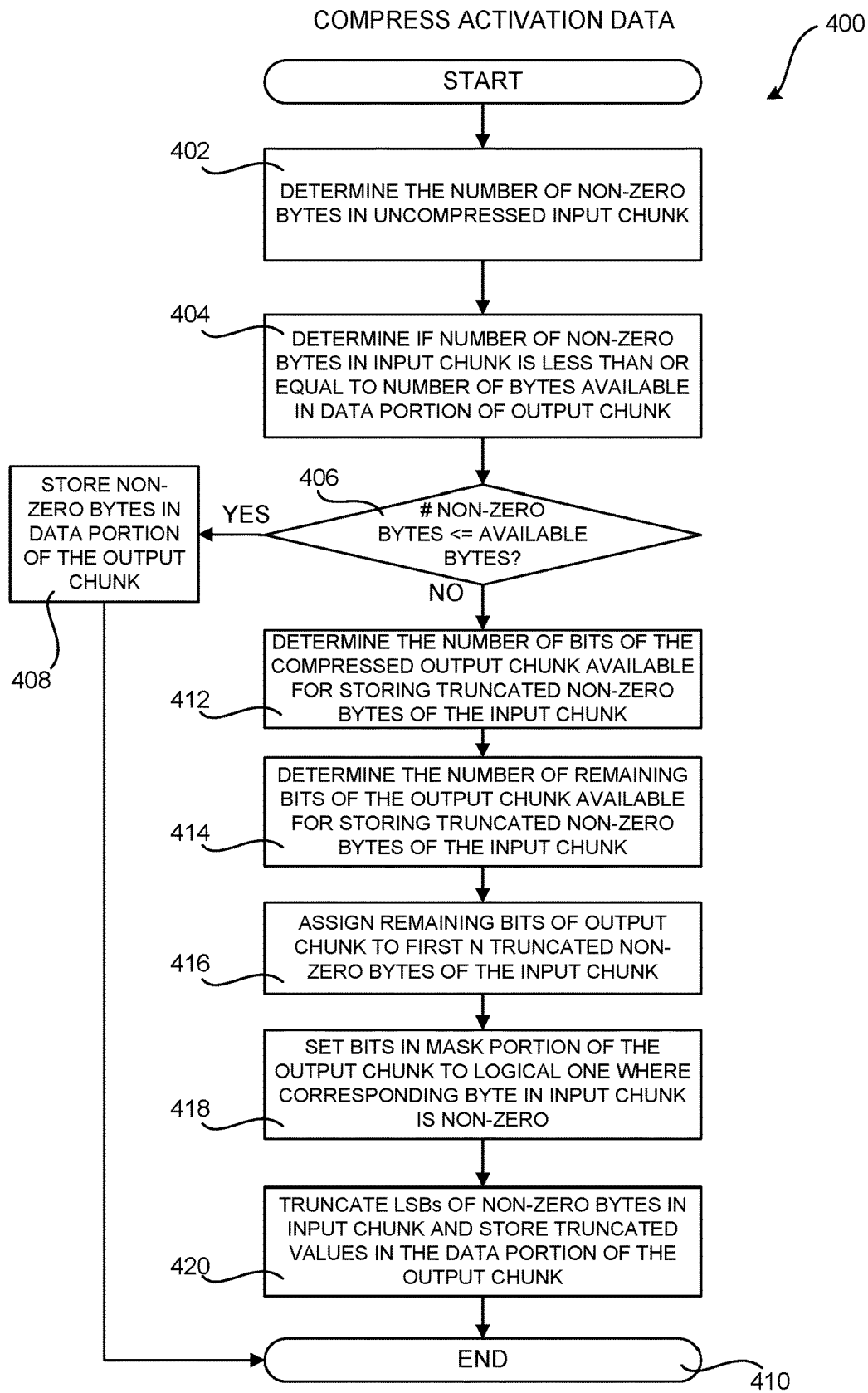
FIG. 4 is a flow diagram showing a routine that illustrates aspects of the operation of the disclosed DNN module for compressing activation data, according to one embodiment disclosed herein.

FIG. 4 is a flow diagram showing a routine 400 that illustrates aspects of the operation of the DNN module 105 for compressing chunks of uncompressed activation data 202, according to one embodiment disclosed herein. It should be appreciated that the logical operations described herein with regard to FIG. 4, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 400 begins at operation 402, where the compression unit 200 determines the number of non-zero bytes in the uncompressed chunk of activation data 202. The routine 400 then proceeds to operation 404, where the compression unit 200 determines if the number of non-zero bytes in the uncompressed chunk of activation data 202 is less than or equal to the number of bytes available in the data portion 210 of the compressed chunk of activation data 204. The non-zero bytes of the uncompressed chunk of activation data 202 do not need to be compressed if the number of non-zero bytes is less than or equal to the number of bytes available in the data portion 210 of the compressed chunk of activation data 204. Accordingly, in this case the routine 400 proceeds to operation 408, where the non-zero bytes are stored in the data portion 210 without truncation.

If the number of non-zero bytes in the uncompressed chunk of activation data 202 is greater than the number of bytes available in the data portion 210 of the compressed chunk of activation data 204, the routine 400 proceeds from operation 406 to operation 412. At operation 412, the compression unit 200 determines the number of bits of the data portion 210 of the compressed chunk of output data 204 available for storing the truncated non-zero bytes of the uncompressed chunk of activation data 202 in the manner described above. The routine 400 then proceeds from operation 412 to operation 414.

At operation 414, the compression unit 200 determines the number of additional bits, if any, in the data portion 210 of the compressed output chunk 204 that are available to store non-zero bytes of the uncompressed chunk of data 202. As discussed above, the compression unit 200 can assign these additional bits to one or more of the non-zero bytes in the uncompressed chunk of data 204 prior to truncating the one or more of the non-zero bytes. This occurs at operation 416.

From operation 416, the routine 400 proceeds to operation 418, where the compression unit 200 sets bits in the mask portion 208 of the compressed chunk of activation data 204 to a logical one where the corresponding byte in the uncompressed chunk of activation 202 is non-zero. The compression unit 200 also sets bits in the mask portion 208 of the compressed chunk of activation data 204 to a logical zero where the corresponding byte in the uncompressed chunk of activation 202 is zero.

From operation 418, the routine 400 then proceeds to operation 420, where the compression unit 200 truncates the LSBs or MSBs of the non-zero bytes in the uncompressed chunk of data 202 to the determined number of bits available in the data portion 210 for each non-zero byte. The truncated non-zero bytes are then stored in the data portion 210 of the compressed chunk of activation data 204. The compression unit 200 then stores the compressed output chunk 204, including the mask portion 208 and the data portion 210 in on-board memory in the DNN module 105 or off-board memory of an application host of the DNN module 105. From operations 408 and 420, the routine 400 proceeds to operation 410, where it ends.

Figure 5A:
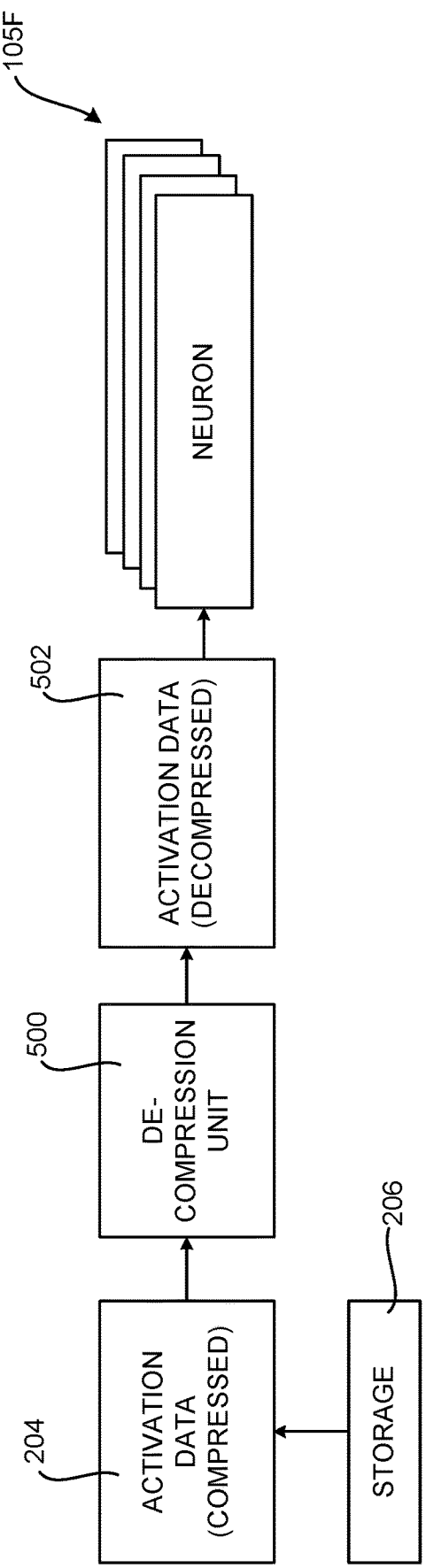
FIGS. 5A and 5B are computing system architecture diagrams showing aspects of the configuration and operation of a DNN module for decompressing activation data, according to one embodiment.
Figure 5B:
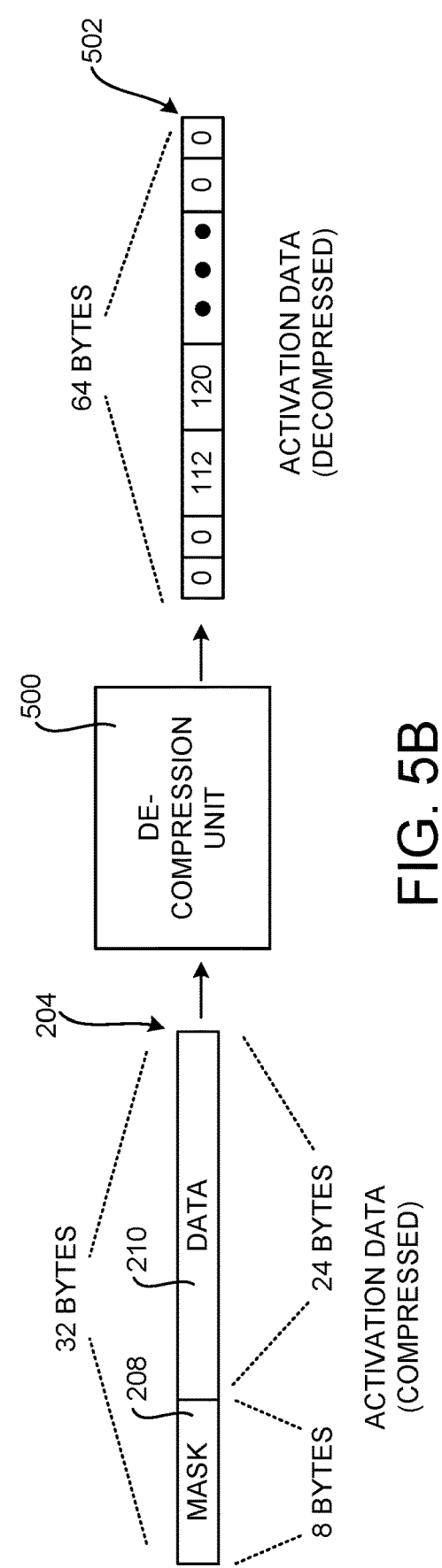

FIGS. 5A and 5B are computing system architecture diagrams showing aspects of the configuration and operation of the DNN module 105 for decompressing compressed activation data, according to one embodiment. As discussed briefly above, and as shown in FIGS. 5A and 5B, the DNN module 105 can also include a decompression unit 500 that can decompress chunks of activation data 204 that have been compressed in the manner described above.

For example, the decompression unit 500 can receive a compressed chunk of activation data 204 from storage 206, such as memory in the DNN processor or memory of an application host. The decompression unit 500 can then determine the number of non-zero bytes in the data portion 210 of the compressed chunk of data 204 based upon the number of logical true bits in the mask portion 208 of the compressed chunk 204. The decompression unit 500 can also determine the locations of the non-zero bytes in the decompressed chunk of data 502 based upon the locations of the logical true bits in the mask portion 208 of the compressed output chunk 204. The decompression unit 500 can determine the locations of the zero bytes in the decompressed chunk of data 502 in a similar manner.

The decompression unit 500 can also determine the number of bits used by the compression unit 200 to store each of the truncated non-zero bytes in the data portion 210 of the compressed output chunk 204. The decompression unit 500 can determine the number of bits used to store each truncated non-zero byte based on the number of non-zero bytes in the compressed chunk of data 204 (as indicated by the mask portion 208) and the target size of the decompressed output chunk 502.

In the example given above, for instance, if the data portion of the compressed chunk of data 204 is 24 bytes wide (i.e. 192 bits) and there are 47 non-zero bytes in the uncompressed chunk of data 202, this means that the compression unit 200 utilized four bits to store each truncated non-zero byte of the uncompressed chunk of data 202 in the data portion 210. The decompression unit 500 can also determine the number of additional bits, if any, that the compression unit 200 allocated to one or more of the truncated non-zero bytes stored in the data portion 210 of the compressed output chunk 204.

For each bit position in the mask portion 208 of the compressed output chunk 204 that is a logical zero, the decompression unit 500 inserts a zero byte into the corresponding position of the decompressed output chunk 502. For each position in the mask portion 208 that is a logical one, the decompression unit 500 inserts the truncated non-zero byte from the corresponding position of the compressed input chunk 204 into a corresponding position of the decompressed output chunk 502 along with a number of zero bits equivalent to the number of bits truncated during compression of the compressed output chunk 204. The zero bits can be inserted into the LSBs or MSBs of the truncated non-zero bytes depending upon which bits were truncated during compression.

As mentioned above, the decompression unit 500 also adds an offset (e.g. 00000001) to one or more of the truncated non-zero bytes stored in the decompressed output chunk 502 in some embodiments. For instance, an offset can be added to non-zero bytes of the uncompressed chunk of data 202 that become zero bytes following compression. In this manner, non-zero bytes will not become zero bytes when decompressed.

Figure 6:
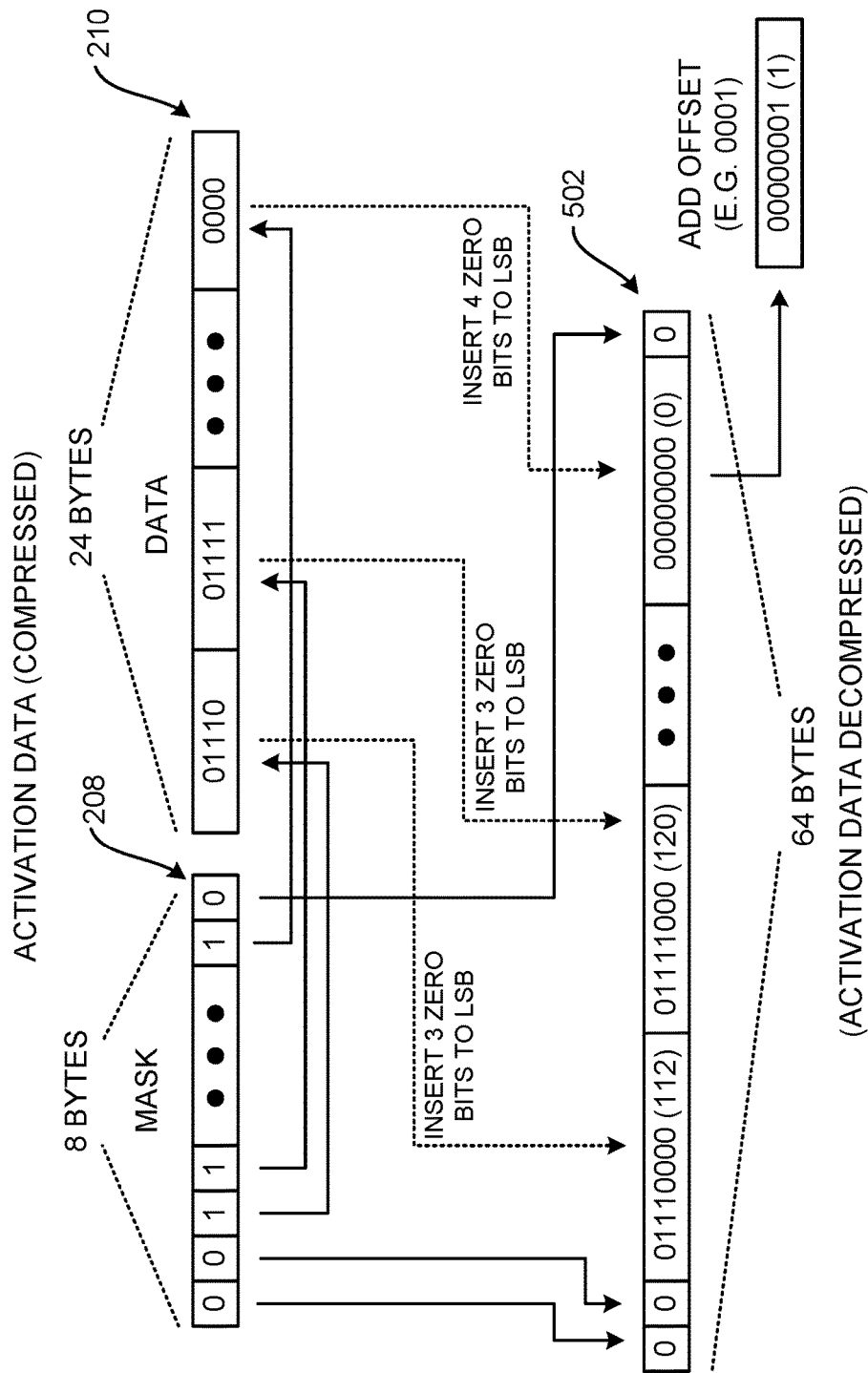
FIG. 6 is a data structure diagram that illustrates aspects of the operation of a DNN module for decompressing activation data with reference to an example chunk of compressed activation data, according to one embodiment.

FIG. 6 is a data structure diagram that illustrates aspects of the operation of the DNN module 105 for decompressing activation data with reference to an example chunk of compressed activation data, according to one embodiment. The example shown in FIG. 6 illustrates decompression of the compressed activation data 204 generated in the example described above with regard to FIG. 3. As shown in FIG. 6, the mask portion 208 stores zeroes in bits zero, one, and 63 and stores ones in bits two, three, and 62. The data portion 210 stores the values 01110, 01111, and 0000 in the manner shown in FIG. 6.

As the decompression unit 500 performs the processing operations described above, the logical zero in the first bit position of the mask portion 208 will cause the decompression unit 500 to store a zero byte as the first byte of the decompressed chunk of activation data 502. Similarly, the logical zero in the second bit position of the mask portion 208 will cause the decompression unit 500 to store a zero byte as the second byte of the decompressed chunk of data 502.

The logical one in the third position of the mask portion 208 will cause the decompression unit 500 to retrieve the first five bits (i.e. 01110) of the data portion 210 and to insert three LSBs, resulting in the value 01110000 (112) being stored as the third byte of the decompressed chunk of activation data 502. Similarly, the logical one in the fourth bit position of the mask portion 208 will cause the decompression unit 500 to retrieve the second five bits (i.e. 01111) of the data portion 210 and to insert three LSBs, resulting in the value 01111000 (120) being stored as the fourth byte of the decompressed chunk of activation data 502.

The logical one in the $63^{rd}$ bit position of the mask portion 208 will cause the decompression unit 500 to retrieve the last four bits of the data portion 210 (i.e. 0000) and to insert four zero LSBs, resulting in the value of zero being stored in the $63^{rd}$ byte position of the decompressed chunk of activation data 502. The logical zero in the last bit position of the mask portion 208 will cause the decompression unit 500 to store a zero byte as the last byte of the decompressed chunk of data 502.

As discussed above, the decompression unit 500 can add an offset value to certain bytes in the decompressed chunk of activation data 502. For instance, the decompression unit 500 can add an offset value, such as 00000001, to bytes that were non-zero in the uncompressed chunk of activation data 202 but that were compressed to zero bytes in the compressed chunk of activation data 204.

In the example shown in FIG. 6, the last byte in the data portion 210 was non-zero (i.e. two) in the uncompressed chunk of activation data 202 but became zero in the compressed chunk of activation data 504. Accordingly, the decompression unit 500 can add an offset value, such as 00000001, to this byte, thereby ensuring that non-zero bytes in the uncompressed chunks of activation data 202 will not be compressed to zero bytes.

Figure 7:
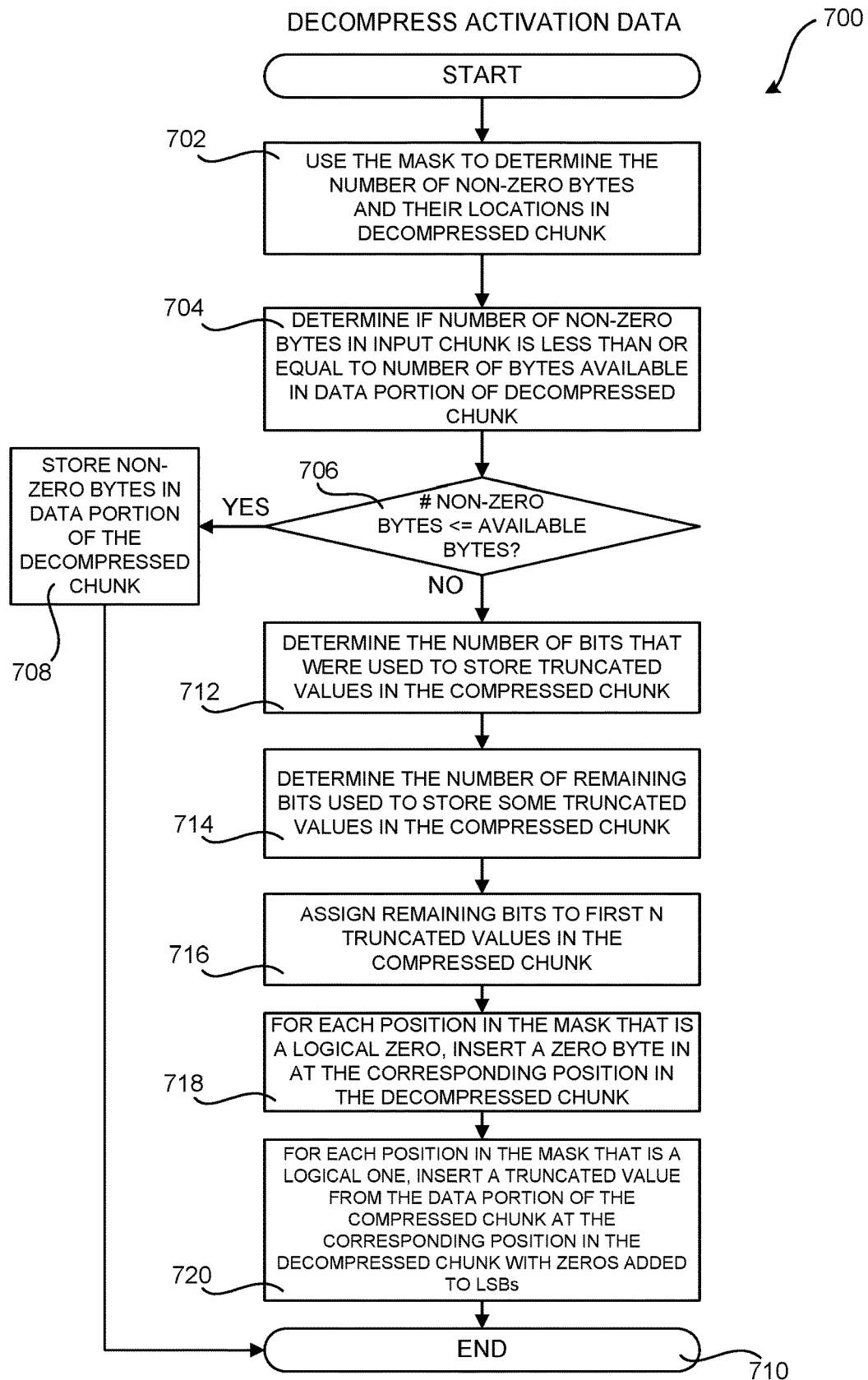
FIG. 7 is a flow diagram showing a routine that illustrates aspects of the operation of the disclosed DNN module for decompressing activation data, according to one embodiment disclosed herein.

FIG. 7 is a flow diagram showing a routine 700 that illustrates aspects of the operation of the DNN module 105 for decompressing activation data, according to one embodiment disclosed herein. The routine 700 begins at operation 702, where the decompression unit 500 utilizes the mask portion 208 of a compressed chunk of activation data 204 to determine the number of non-zero bytes and their locations in the decompressed chunk of activation data 502.

The routine 700 proceeds from operation 702 to operation 704, where the decompression unit 500 determines if the number of non-zero bytes in the compressed chunk of activation data 204 is less than or equal to the number of bytes of the decompressed chunk of activation data 502. As discussed above, the non-zero bytes of the compressed chunk of activation data 204 do not need to be decompressed if the number of non-zero bytes is less than or equal to the number of bytes of the decompressed chunk of activation data 502. Accordingly, in this case the routine 700 proceeds to operation 708, where the non-zero bytes in the compressed chunk of activation data 204 are stored in the decompressed chunk of activation data 502 without modification.

If the number of non-zero bytes in the compressed chunk of activation data 504 is greater than the number of bytes in the decompressed chunk of activation data 502, the routine 700 proceeds from operation 706 to operation 712. At operation 712, the decompression unit 500 determines the number of bits of the data portion 210 of the compressed chunk of output data 204 that the compression unit 200 used to store each truncated non-zero byte of the uncompressed chunk of activation data 202. The routine 700 then proceeds from operation 712 to operation 714 in the manner described above.

At operation 714, the decompression unit 500 determines the number of additional bits, if any, that were used to store non-zero bytes of the uncompressed chunk of data 202. The decompression unit 500 can assign these additional bits to one or more of the non-zero bytes in the decompressed chunk of data 502 in the manner described above. This occurs at operation 716.

From operation 716, the routine 700 proceeds to operation 718, where the decompression unit 500 inserts a zero byte into the corresponding position of the decompressed output chunk 502 for each bit position in the mask portion 208 of the compressed output chunk 204 that is a logical zero. For each bit position in the mask portion 208 of the compressed output chunk 204 that is a logical one, the decompression unit 500 inserts the truncated non-zero bytes from the corresponding positions of the compressed input chunk 204 into a corresponding position of the decompressed output chunk 502 along with a number of zero bits equivalent to the number of bits truncated during compression of the compressed output chunk 204. The zero bits can be inserted into the LSBs or MSBs of the truncated non-zero bytes depending upon which bits were truncated during compression. This occurs at operation 720.

The decompression unit 500 can also add an offset value to one or more of the truncated non-zero bytes stored in the decompressed output chunk 502 in some embodiments. For instance, an offset can be added to non-zero bytes of the uncompressed chunk of data 202 that become zero bytes following compression. In this manner, non-zero bytes will not become zero bytes when compressed and decompressed. An offset can be added to all of the bytes in the decompressed chunk of activation data 502 in other embodiments.

The decompression unit 500 then stores the decompressed output chunk 502 in on-board memory in the DNN module 105 or off-board memory of an application host of the DNN module 105 for use by the neurons 105F. From operations 708 and 720, the routine 400 proceeds to operation 710, where it ends.

Figure 8:
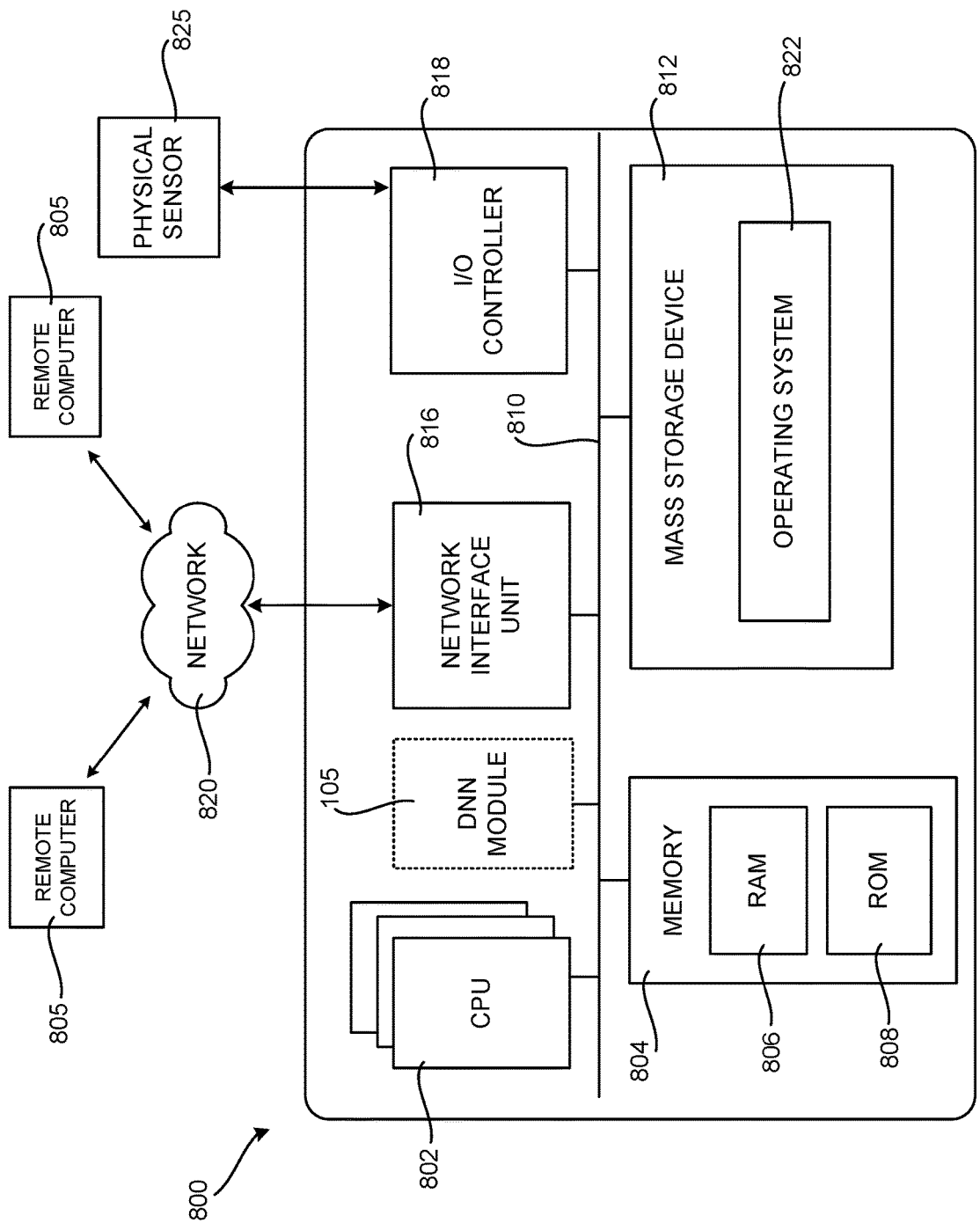
FIG. 8 is a computer architecture diagram showing an illustrative computer hardware and software architecture for a computing device that can act as an application host for the DNN module presented herein, according to one embodiment.

FIG. 8 is a computer architecture diagram showing an illustrative computer hardware and software architecture for a computing device that can act as an application host for the DNN module 105 presented herein. In particular, the architecture illustrated in FIG. 8 can be utilized to implement a server computer, mobile phone, an e-reader, a smartphone, a desktop computer, an AR/VR device, a tablet computer, a laptop computer, or another type of computing device suitable for use with the DNN module 105.

The computer 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system ("BIOS" or "firmware") containing the basic routines that help to transfer information between elements within the computer 800, such as during startup, can be stored in the ROM 808. The computer 800 further includes a mass storage device 812 for storing an operating system 822, application programs, and other types of programs. The mass storage device 812 can also be configured to store other types of programs and data.

The mass storage device 812 is connected to the CPU 802 through a mass storage controller (not shown) connected to the bus 810. The mass storage device 812 and its associated computer readable media provide non-volatile storage for the computer 800. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 800. For purposes of the claims, the phrase "computer storage medium," and variations thereof, does not include waves or signals per se or communication media.

According to various configurations, the computer 800 can operate in a networked environment using logical connections to remote computers 805 through a network such as the network 820. The computer 800 can connect to the network 820 through a network interface unit 816 connected to the bus 810. It should be appreciated that the network interface unit 816 can also be utilized to connect to other types of networks and remote computer systems. The computer 800 can also include an input/output controller 818 for receiving and processing input from a number of other devices, including a keyboard, mouse, touch input, an electronic stylus (not shown in FIG. 8), or a physical sensor 825 such as a video camera. Similarly, the input/output controller 818 can provide output to a display screen or other type of output device (also not shown in FIG. 8).

It should be appreciated that the software components described herein, when loaded into the CPU 802 and executed, can transform the CPU 802 and the overall computer 800 from a general-purpose computing device into a special-purpose computing device customized to facilitate the functionality presented herein. The CPU 802 can be constructed from any number of transistors or other discrete circuit elements, which can individually or collectively assume any number of states. More specifically, the CPU 802 can operate as a finite-state machine, in response to executable instructions contained within the software modules disclosed herein. These computer-executable instructions can transform the CPU 802 by specifying how the CPU 802 transitions between states, thereby transforming the transistors or other discrete hardware elements constituting the CPU 802.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 800 in order to store and execute the software components presented herein. It also should be appreciated that the architecture shown in FIG. 8 for the computer 800, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 800 might not include all of the components shown in FIG. 8, can include other components that are not explicitly shown in FIG. 8, or can utilize an architecture completely different than that shown in FIG. 8.

Figure 9:
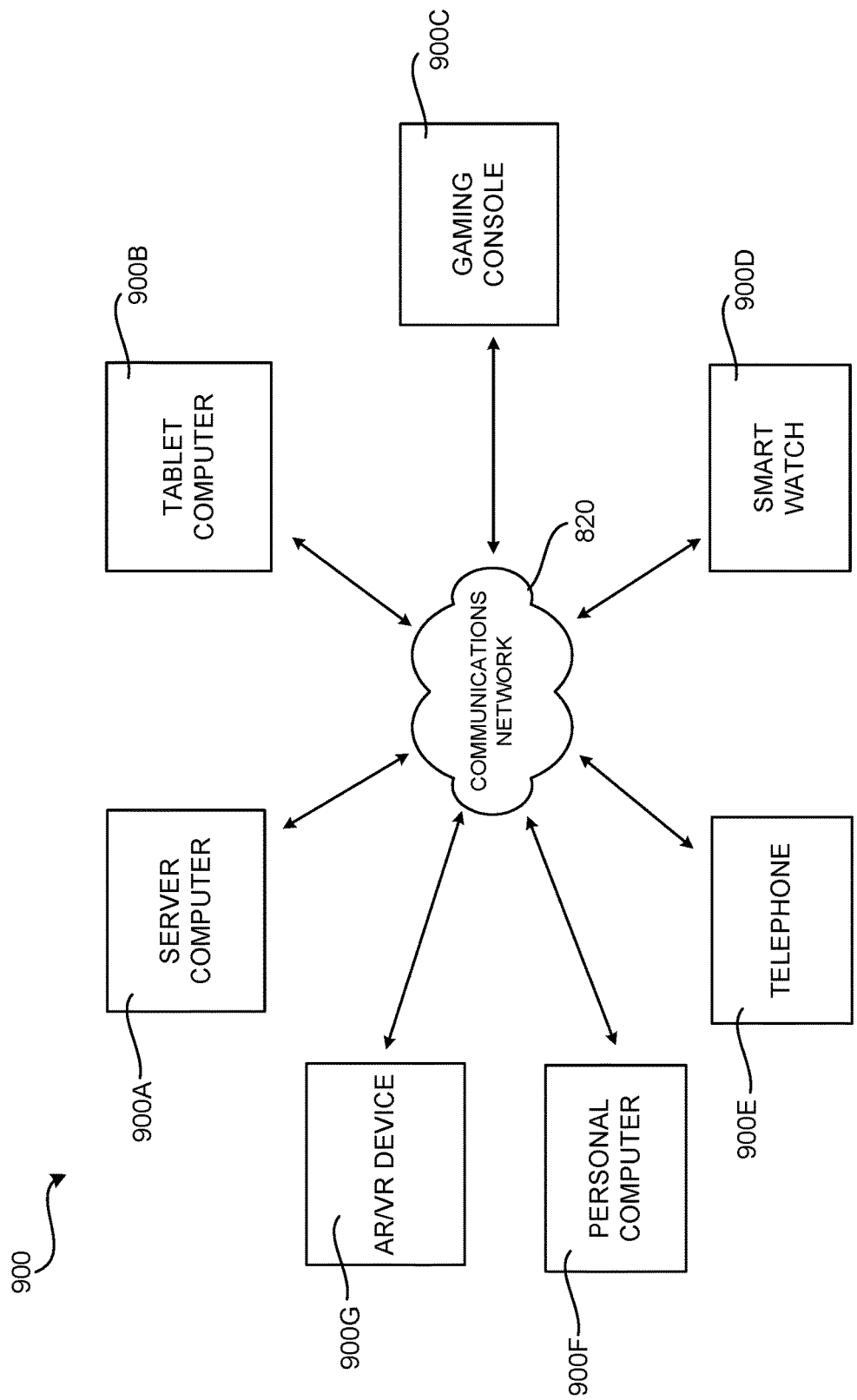
FIG. 9 is a network diagram illustrating a distributed computing environment in which aspects of the disclosed technologies can be implemented, according to various embodiments presented herein.

FIG. 9 is a network diagram illustrating a distributed network computing environment 900 in which aspects of the disclosed technologies can be implemented, according to various embodiments presented herein. As shown in FIG. 9, one or more server computers 900A can be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 900B, a gaming console 900C, a smart watch 900D, a telephone 900E, such as a smartphone, a personal computer 900F, and an AR/VR device 900G.

In a network environment in which the communications network 820 is the Internet, for example, the server computer 900A can be a dedicated server computer operable to process and communicate data to and from the client computing devices 900B-900G via any of a number of known protocols, such as, hypertext transfer protocol ("HTTP"), file transfer protocol ("FTP"), or simple object access protocol ("SOAP"). Additionally, the networked computing environment 900 can utilize various data security protocols such as secured socket layer ("SSL") or pretty good privacy ("PGP"). Each of the client computing devices 900B-900G can be equipped with an operating system operable to support one or more computing applications or terminal sessions such as a web browser (not shown in FIG. 9), or other graphical user interface (not shown in FIG. 9), or a mobile desktop environment (not shown in FIG. 9) to gain access to the server computer 900A.

The server computer 900A can be communicatively coupled to other computing environments (not shown in FIG. 9) and receive data regarding a participating user's interactions/resource network. In an illustrative operation, a user (not shown in FIG. 9) may interact with a computing application running on a client computing device 900B-900G to obtain desired data and/or perform other computing applications.

The data and/or computing applications may be stored on the server 900A, or servers 900A, and communicated to cooperating users through the client computing devices 900B-900G over an exemplary communications network 820. A participating user (not shown in FIG. 9) may request access to specific data and applications housed in whole or in part on the server computer 8800A. These data may be communicated between the client computing devices 900B-900G and the server computer 900A for processing and storage.

The server computer 900A can host computing applications, processes and applets for the generation, authentication, encryption, and communication of data and applications, and may cooperate with other server computing environments (not shown in FIG. 9), third party service providers (not shown in FIG. 9), network attached storage ("NAS") and storage area networks ("SAN") to realize application/data transactions.

It should be appreciated that the computing architecture shown in FIG. 8 and the distributed network computing environment shown in FIG. 9 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network processor, comprising: one or more neurons; and a compression unit configured to receive an uncompressed chunk of data generated by at least one of the neurons in the neural network processor, the uncompressed chunk of data comprising a fixed number of bytes; generate a mask portion of a compressed output chunk, the mask portion comprising a number of bits equivalent to the fixed number of bytes in the uncompressed chunk of data, each bit in the mask portion corresponding to a byte in the uncompressed chunk of data, and wherein each bit in the mask portion is set to a logical zero where a corresponding byte in the uncompressed chunk of data is zero and is set to a logical one where a corresponding byte in the uncompressed chunk of data is non-zero; generate a data portion of the compressed output chunk by determining a number of non-zero bytes in the uncompressed chunk of data, determining, based on the number of non-zero bytes in the uncompressed chunk of data, a number of bits in the data portion of the compressed output chunk available to store truncated non-zero bytes of the uncompressed chunk of data, truncating the non-zero bytes in the uncompressed chunk of data to the determined number of bits, and storing the truncated non-zero bytes in the data portion of the compressed output chunk; and output the compressed output chunk, the compressed output chunk comprising the mask portion and the data portion.

Clause 2. The neural network processor of clause 1, wherein the neural network processor further comprises a decompression unit configured to: receive the compressed output chunk; determine the number of non-zero bytes in the data portion of the uncompressed chunk of data based upon the mask portion of the compressed output chunk; determine locations of the non-zero bytes in the uncompressed chunk of data based upon the mask portion of the compressed output chunk; determine the number of bits used by the compression unit to store the truncated non-zero bytes in the data portion of the compressed output chunk; for each position in the mask portion of the compressed output chunk that is a logical zero, insert a zero byte into a corresponding position of a decompressed output chunk; and for each position in the mask portion that is a logical one, insert the truncated non-zero byte from the corresponding position of the compressed input chunk into a corresponding position of the decompressed output chunk and a number of zero bits equivalent to the number of bits truncated during compression of the compressed output chunk.

Clause 3. The neural network processor of any of clauses 1 and 2, wherein the compression unit is further configured to: determine a number of additional bits in the data portion of the compressed output chunk available to store truncated non-zero bytes of the uncompressed chunk of data; and allocate the additional bits to one or more of the non-zero bytes in the uncompressed chunk of data prior to truncating the one or more of the non-zero bytes.

Clause 4. The neural network processor of any of clauses 1-3, wherein the decompression unit is further configured to determine the number of additional bits allocated to the one or more of the non-zero bytes stored in the data portion of the compressed output chunk.

Clause 5. The neural network processor of any of clauses 1-4, wherein the decompression unit is further configured to add an offset to one or more of the truncated non-zero bytes stored in the decompressed output chunk.

Clause 6. The neural network processor of any of clauses 1-5, wherein one or more least significant bits (LSBs) of the non-zero bytes are truncated.

Clause 7. The neural network processor of any of clauses 1-6, wherein one or more most significant bits (MSBs) of the non-zero bytes are truncated.

Clause 8. A neural network processor, comprising: one or more neurons; and a decompression unit configured to receive a compressed chunk of data comprising a mask portion and a data portion; determine a number of non-zero bytes in a decompressed chunk of data based upon bits in the mask portion; determine, based at least in part on the number of non-zero bytes, a number of bits used to store truncated non-zero bytes in the data portion of the compressed output chunk of data; for each bit position in the mask portion of the compressed chunk of data that is a logical zero, insert a zero byte into a corresponding position of the decompressed chunk of data; and for each position in the mask portion of the compressed chunk of data that is a logical one, insert a truncated non-zero byte from the corresponding position in the data portion of the compressed chunk of data into a corresponding position in the decompressed chunk of data and a number of zero bits equivalent to a number of bits truncated during compression of the compressed chunk of data.

Clause 9. The neural network processor of clause 8, further comprising a compression unit configured to: receive an uncompressed chunk of data generated by at least one of the neurons in the neural network processor, the uncompressed chunk of data comprising a fixed number of bytes; generate the mask portion of the compressed chunk of data, the mask portion comprising a number of bits equivalent to the fixed number of bytes in the uncompressed chunk of data, each bit in the mask portion corresponding to a byte in the uncompressed chunk of data, and wherein each bit in the mask portion comprises a logical zero where a corresponding byte in the uncompressed chunk of data is zero and comprises a logical one where a corresponding byte in the uncompressed chunk of data is non-zero; generate the data portion of the compressed data chunk by determining a number of non-zero bytes in the uncompressed chunk of data, determining, based on the number of non-zero bytes in the uncompressed chunk of data, a number of bits in the data portion of the compressed chunk of data available to store truncated non-zero bytes of the uncompressed chunk of data, truncating the non-zero bytes in the uncompressed chunk of data to the determined number of bits, and storing the truncated non-zero bytes in the data portion of the compressed chunk of data; and output the compressed chunk of data, the compressed chunk of data comprising the mask portion and the data portion.

Clause 10. The neural network processor of any of clauses 8 and 9, wherein the compression unit is further configured to store the non-zero bytes in the uncompressed chunk of data in the data portion of the compressed chunk of data without truncation if the number of non-zero bytes in the uncompressed chunk of data is less than or equal to a number of bytes in the data portion of the compressed chunk of data.

Clause 11. The neural network processor of any of clauses 8-10, wherein the compression unit is further configured to: determine a number of additional bits in the data portion of the compressed output chunk available to store truncated non-zero bytes of the uncompressed chunk of data; and allocate the additional bits to one or more of the non-zero bytes in the uncompressed chunk of data prior to truncating the one or more of the non-zero bytes.

Clause 12. The neural network processor of any of clauses 8-11, wherein the decompression unit is further configured to determine the number of additional bits allocated to the one or more of the non-zero bytes stored in the data portion of the compressed output chunk.

Clause 13. The neural network processor of any of clauses 8-12, wherein one or more least significant bits (LSBs) of the non-zero bytes are truncated during compression of the compressed chunk of data.

Clause 14. The neural network processor of any of clauses 8-13, wherein one or more most significant bits (MSBs) of the non-zero bytes are truncated during compression of the compressed chunk of data.

Clause 15. A computer-implemented method, comprising: receiving, at a compression unit of a neural network processor, an uncompressed chunk of data generated by at least one neuron in the neural network processor, the uncompressed chunk of data comprising a fixed number of bytes; generating a mask portion of a compressed output chunk, the mask portion comprising a number of bits equivalent to the fixed number of bytes in the uncompressed chunk of data, each bit in the mask portion corresponding to a byte in the uncompressed chunk of data, and wherein each bit in the mask portion comprises a logical zero where a corresponding byte in the uncompressed chunk of data is zero and comprises a logical one where a corresponding byte in the uncompressed chunk of data is non-zero; generating a data portion of the compressed output chunk by determining a number of non-zero bytes in the uncompressed chunk of data, determining, based on the number of non-zero bytes in the uncompressed chunk of data, a number of bits in the data portion of the compressed output chunk available to store truncated non-zero bytes of the uncompressed chunk of data, truncating the non-zero bytes in the uncompressed chunk of data to the determined number of bits, and storing the truncated non-zero bytes in the data portion of the compressed output chunk; and storing the compressed output chunk in a memory of the neural network processor, the compressed output chunk comprising the mask portion and the data portion.

Clause 16. The computer-implemented method of clause 15, further comprising: determining a number of additional bits in the data portion of the compressed output chunk available to store truncated non-zero bytes of the uncompressed chunk of data; and allocating the additional bits to one or more of the non-zero bytes in the uncompressed chunk of data prior to truncating the one or more of the non-zero bytes.

Clause 17. The computer-implemented method of any of clauses 15 and 16, further comprising storing the non-zero bytes in the uncompressed chunk of data in the data portion of the compressed chunk of data without truncation if the number of non-zero bytes in the uncompressed chunk of data is less than or equal to a number of bytes in the data portion of the compressed chunk of data.

Clause 18. The computer-implemented method of any of clauses 15-17, further comprising: receiving, at a decompression unit of a neural network processor, the compressed output chunk; determining the number of non-zero bytes in the data portion of the uncompressed chunk of data based upon the mask portion of the compressed output chunk; determining locations of the non-zero bytes in the uncompressed chunk of data based upon the mask portion of the compressed output chunk; determine the number of bits used by the compression unit to store the truncated non-zero bytes in the data portion of the compressed output chunk; for each bit position in the mask portion of the compressed output chunk that is a logical zero, insert a zero byte into a corresponding position of a decompressed output chunk; and for each position in the mask portion of the compressed output chunk that is a logical one, insert the truncated non-zero byte from the corresponding position of the compressed output chunk into a corresponding position of the decompressed output chunk and a number of zero bits equivalent to the number of bits truncated during compression of the compressed output chunk.

Clause 19. The computer-implemented method of any of clauses 15-18, further comprising adding an offset to one or more of the truncated non-zero bytes stored in the decompressed output chunk.

Clause 20. The computer-implemented method of any of clauses 15-19, wherein the offset is added to one or more least significant bits (LSBs) of the truncated non-zero bytes stored in the decompressed output chunk.

Based on the foregoing, it should be appreciated that a DNN module that can compress and decompress activation data to reduce the utilization of memory bus bandwidth has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network processor, comprising:
   one or more neurons; and
   a compression unit that
   receives an uncompressed chunk of data generated by at least one of the neurons in the neural network processor, the uncompressed chunk of data comprising a fixed number of bytes;
   generates a mask portion of a compressed output chunk, the mask portion comprising a number of bits equivalent to the fixed number of bytes in the uncompressed chunk of data, each bit in the mask portion corresponding to a byte in the uncompressed chunk of data, and wherein each bit in the mask portion is set to a logical zero where a corresponding byte in the uncompressed chunk of data is zero and is set to a logical one where a corresponding byte in the uncompressed chunk of data is non-zero;
   generates a data portion of the compressed output chunk by
      determining a number of non-zero bytes in the uncompressed chunk of data,
      determining, based on the number of non-zero bytes in the uncompressed chunk of data, a number of bits in the data portion of the compressed output chunk available to store truncated non-zero bytes of the uncompressed chunk of data,
      truncating the non-zero bytes in the uncompressed chunk of data to the determined number of bits if the number of non-zero bytes in the uncompressed chunk of data is greater than a number of bytes in the data portion of the compressed output chunk, and
      storing the truncated non-zero bytes in the data portion of the compressed output chunk; and
   outputs the compressed output chunk, the compressed output chunk comprising the mask portion and the data portion.

2. The neural network processor of claim 1, wherein the neural network processor further comprises a decompression unit that:
   receives the compressed output chunk;
   determines the number of non-zero bytes in the data portion of the uncompressed chunk of data based upon the mask portion of the compressed output chunk;
   determines locations of the non-zero bytes in the uncompressed chunk of data based upon the mask portion of the compressed output chunk;
   determines the number of bits used by the compression unit to store the truncated non-zero bytes in the data portion of the compressed output chunk;
   for each position in the mask portion of the compressed output chunk that is a logical zero, inserts a zero byte into a corresponding position of a decompressed output chunk; and
   for each position in the mask portion that is a logical one, inserts the truncated non-zero byte from the corresponding position of the compressed input chunk into a corresponding position of the decompressed output chunk and a number of zero bits equivalent to the number of bits truncated during compression of the compressed output chunk.

3. The neural network processor of claim 2, wherein the compression unit:
   determines a number of additional bits in the data portion of the compressed output chunk available to store truncated non-zero bytes of the uncompressed chunk of data; and
   allocates the additional bits to one or more of the non-zero bytes in the uncompressed chunk of data prior to truncating the one or more of the non-zero bytes.

4. The neural network processor of claim 3, wherein the decompression unit determines the number of additional bits allocated to the one or more of the non-zero bytes stored in the data portion of the compressed output chunk.

5. The neural network processor of claim 2, wherein the decompression unit adds an offset to one or more of the truncated non-zero bytes stored in the decompressed output chunk.

6. The neural network processor of claim 1, wherein one or more least significant bits (LSBs) of the non-zero bytes are truncated.

7. The neural network processor of claim 1, wherein one or more most significant bits (MSBs) of the non-zero bytes are truncated.

8. A neural network processor, comprising:
one or more neurons; and
a decompression unit that
receives a compressed chunk of data comprising a mask portion and a data portion;
determines a number of non-zero bytes in a decompressed chunk of data based upon bits in the mask portion;
determines, based at least in part on the number of non-zero bytes, a number of bits used to store truncated non-zero bytes in the data portion of the compressed chunk of data;
for each bit position in the mask portion of the compressed chunk of data that is a logical zero, inserts a zero byte into a corresponding position of the decompressed chunk of data; and
for each position in the mask portion of the compressed chunk of data that is a logical one, inserts a truncated non-zero byte from the corresponding position in the data portion of the compressed chunk of data into a corresponding position in the decompressed chunk of data and a number of zero bits equivalent to a number of bits truncated during compression of the compressed chunk of data.

9. The neural network processor of claim 8, further comprising a compression unit that:
receives an uncompressed chunk of data generated by at least one of the neurons in the neural network processor, the uncompressed chunk of data comprising a fixed number of bytes;
generates the mask portion of the compressed chunk of data, the mask portion comprising a number of bits equivalent to the fixed number of bytes in the uncompressed chunk of data, each bit in the mask portion corresponding to a byte in the uncompressed chunk of data, and wherein each bit in the mask portion comprises a logical zero where a corresponding byte in the uncompressed chunk of data is zero and comprises a logical one where a corresponding byte in the uncompressed chunk of data is non-zero;
generates the data portion of the compressed data chunk by
determining a number of non-zero bytes in the uncompressed chunk of data,
determining, based on the number of non-zero bytes in the uncompressed chunk of data, a number of bits in the data portion of the compressed chunk of data available to store truncated non-zero bytes of the uncompressed chunk of data,
truncating the non-zero bytes in the uncompressed chunk of data to the determined number of bits if the number of non-zero bytes in the uncompressed chunk of data is greater than a number of bytes in the data portion of the compressed chunk of data, and
storing the truncated non-zero bytes in the data portion of the compressed chunk of data; and
outputs the compressed chunk of data, the compressed chunk of data comprising the mask portion and the data portion.

10. The neural network processor of claim 9, wherein the compression unit stores the non-zero bytes in the uncompressed chunk of data in the data portion of the compressed chunk of data without truncation if the number of non-zero bytes in the uncompressed chunk of data is less than or equal to the number of bytes in the data portion of the compressed chunk of data.

11. The neural network processor of claim 9, wherein the compression unit:
determines a number of additional bits in the data portion of the compressed chunk of data available to store the truncated non-zero bytes of the uncompressed chunk of data; and
allocates the additional bits to one or more of the non-zero bytes in the uncompressed chunk of data prior to truncating the one or more of the non-zero bytes.

12. The neural network processor of claim 11, wherein the decompression unit determines the number of additional bits allocated to the one or more of the non-zero bytes stored in the data portion of the compressed chunk of data.

13. The neural network processor of claim 8, wherein one or more least significant bits (LSBs) of the non-zero bytes are truncated during compression of the compressed chunk of data.

14. The neural network processor of claim 8, wherein one or more most significant bits (MSBs) of the non-zero bytes are truncated during compression of the compressed chunk of data.

15. A computer-implemented method, comprising:
receiving, at a compression unit of a neural network processor, an uncompressed chunk of data generated by at least one neuron in the neural network processor, the uncompressed chunk of data comprising a fixed number of bytes;
generating a mask portion of a compressed output chunk, the mask portion comprising
a number of bits equivalent to the fixed number of bytes in the uncompressed chunk of data,
each bit in the mask portion corresponding to a byte in the uncompressed chunk of data, and
wherein each bit in the mask portion comprises a logical zero where a corresponding byte in the uncompressed chunk of data is zero and comprises a logical one where a corresponding byte in the uncompressed chunk of data is non-zero;
generating a data portion of the compressed output chunk by
determining a number of non-zero bytes in the uncompressed chunk of data,
determining, based on the number of non-zero bytes in the uncompressed chunk of data, a number of bits in the data portion of the compressed output chunk available to store truncated non-zero bytes of the uncompressed chunk of data,
determining that the number of non-zero bytes in the uncompressed chunk of data is greater than a number of bytes in the data portion of the compressed output chunk;
truncating the non-zero bytes in the uncompressed chunk of data to the determined number of bits in response to determining that the number of non-zero bytes in the uncompressed chunk of data is greater than a number of bytes in the data portion of the compressed output chunk, and storing the truncated non-zero bytes in the data portion of the compressed output chunk; and storing the compressed output chunk in a memory of the neural network processor, the compressed output chunk comprising the mask portion and the data portion.

16. The computer-implemented method of claim 15, further comprising:

determining a number of additional bits in the data portion of the compressed output chunk available to store the truncated non-zero bytes of the uncompressed chunk of data; and allocating the additional bits to one or more of the non-zero bytes in the uncompressed chunk of data prior to truncating the one or more of the non-zero bytes.

17. The computer-implemented method of claim 15, further comprising storing the non-zero bytes in the uncompressed chunk of data in the data portion of the compressed output chunk without truncation if the number of non-zero bytes in the uncompressed chunk of data is less than or equal to the number of bytes in the data portion of the compressed output chunk.

18. The computer-implemented method of claim 15, further comprising:

receiving, at a decompression unit of the neural network processor, the compressed output chunk;

determining the number of non-zero bytes in the data portion of the uncompressed chunk of data based upon the mask portion of the compressed output chunk;

determining locations of the non-zero bytes in the uncompressed chunk of data based upon the mask portion of the compressed output chunk;

determine the number of bits used by the compression unit to store the truncated non-zero bytes in the data portion of the compressed output chunk;

for each bit position in the mask portion of the compressed output chunk that is a logical zero, insert a zero byte into a corresponding position of a decompressed output chunk; and for each position in the mask portion of the compressed output chunk that is a logical one, insert the truncated non-zero byte from the corresponding position of the compressed output chunk into a corresponding position of the decompressed output chunk and a number of zero bits equivalent to the number of bits truncated during compression of the compressed output chunk.

19. The computer-implemented method of claim 18, further comprising adding an offset to one or more of the truncated non-zero bytes stored in the decompressed output chunk.

20. The computer-implemented method of claim 19, wherein the offset is added to one or more least significant bits (LSBs) of the truncated non-zero bytes stored in the decompressed output chunk.

* * * * *